US009170561B2

(12) United States Patent
Miyagawa et al.

(10) Patent No.: US 9,170,561 B2
(45) Date of Patent: Oct. 27, 2015

(54) COOLING DEVICE AND IMAGE FORMING APPARATUS INCORPORATING SAME

(71) Applicants: Hiroaki Miyagawa, Ibaraki (JP); Koji Kawahara, Ibaraki (JP)

(72) Inventors: Hiroaki Miyagawa, Ibaraki (JP); Koji Kawahara, Ibaraki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/151,180

(22) Filed: Jan. 9, 2014

(65) Prior Publication Data

US 2014/0212164 A1 Jul. 31, 2014

(30) Foreign Application Priority Data

Jan. 25, 2013 (JP) ................................ 2013-011740
Feb. 20, 2013 (JP) ................................ 2013-031351

(51) Int. Cl.
*G03G 21/20* (2006.01)
*H05K 7/20* (2006.01)
*G03G 15/08* (2006.01)

(52) U.S. Cl.
CPC .......... *G03G 21/206* (2013.01); *G03G 15/0865* (2013.01)

(58) Field of Classification Search
CPC .................................................. G03G 21/206
USPC ........................................ 399/92; 361/695
See application file for complete search history.

(56) References Cited

U.S. PATENT DOCUMENTS 5,787,321 A * 7/1998 Nishikawa et al. ............ 399/69
7,466,936 B2 * 12/2008 Tokuzaki ........................ 399/92
7,941,069 B2 * 5/2011 Idehara et al. .................. 399/92
8,767,400 B2 * 7/2014 Dickinson et al. ............ 361/695
8,913,913 B2 * 12/2014 Kitajima ......................... 399/92
2006/0120748 A1 * 6/2006 Takehara et al. ................ 399/92
2009/0220252 A1 * 9/2009 Onishi ............................ 399/27
2009/0269112 A1 * 10/2009 Fukunaga et al. ............ 399/360
2009/0285588 A1 * 11/2009 Furuichi et al. ................. 399/27
2011/0280609 A1 * 11/2011 Nakazawa et al. .............. 399/92
2011/0308777 A1 * 12/2011 O'Connor et al. ............ 165/121
2012/0045243 A1 * 2/2012 Nishikawa et al. ............. 399/92
2012/0275813 A1 * 11/2012 Matsumoto ..................... 399/92
2013/0058676 A1 * 3/2013 Sato ............................... 399/92
2013/0064567 A1 * 3/2013 Akama et al. ................... 399/90
2013/0287426 A1 * 10/2013 Sadamitsu ...................... 399/94
2014/0113539 A1 * 4/2014 Dickinson et al. ............ 454/184
2014/0140719 A1 * 5/2014 Suzuki ............................ 399/92
2014/0199091 A1 * 7/2014 Azeyanagi et al. ............ 399/92

FOREIGN PATENT DOCUMENTS

JP 10-149067 6/1998
JP 2003-345199 12/2003

(Continued)

*Primary Examiner* — Billy Lactaoen
*Assistant Examiner* — Arlene Heredia Ocasio
(74) *Attorney, Agent, or Firm* — Harness, Dickey & Pierce, P.L.C.

(57) ABSTRACT

A cooling device, which is included in an image forming apparatus, includes multiple air blowers to cool a cooling target provided to the image forming apparatus and a duct to connect with the multiple air blowers and to flow airflow generated by the multiple air blowers therethrough and to have an opening formed thereon and disposed at a position shifted to a part of the multiple air blowers. Respective outputs of the multiple air blowers are different from each other according to respective positions of the multiple air blowers with respect to the opening.

16 Claims, 20 Drawing Sheets

(56) References Cited

FOREIGN PATENT DOCUMENTS

| | | | |
|---|---|---|---|
| JP | 2004-354663 | | 12/2004 |
| JP | 2007-078902 | | 3/2007 |
| JP | 2007-316189 | | 12/2007 |
| JP | 2010-032577 | | 2/2010 |
| JP | 2011-180161 | | 9/2011 |
| JP | 2012-018335 | | 1/2012 |
| JP | 2012-032665 | | 2/2012 |
| JP | 2013088769 | A * | 5/2013 |

* cited by examiner

COOLING DEVICE AND IMAGE FORMING APPARATUS INCORPORATING SAME

CROSS-REFERENCE TO RELATED APPLICATIONS

This patent application is based on and claims priority pursuant to 35 U.S.C. §119 to Japanese Patent Application Nos. 2013-011740, filed on Jan. 25, 2013 and 2013-031351, filed on Feb. 20, 2013 in the Japan Patent Office, the entire disclosures of which are hereby incorporated by reference herein.

BACKGROUND

1. Technical Field

Embodiments of the present invention relate to a cooling device and an image forming apparatus including the cooling device.

2. Related Art

Japanese Patent Application Publication No. JP 2010-032577-A discloses a cooling device that includes multiple fans to suck air through multiple cooling target parts in a body of an image forming apparatus and a duct bank to discharge airflow introduced through the fans from a single air discharging port (opening). The cooling device can be applied to an image forming apparatus. The cooling device utilizes limited space to supply air toward the multiple cooling target parts to cool multiple cooling target parts efficiently and reliably. Therefore, respective air supplying units are provided to the multiple cooling target parts, and airflows discharged to a collected airflow path from multiple air discharging paths provided to respective cooling target parts are guided from the collected airflow path without interfering each other.

SUMMARY

At least one embodiment of the present invention provides a cooling device including multiple air blowers to cool a cooling target and a duct to connect with the multiple air blowers and to flow airflow generated by the multiple air blowers therethrough, and to have an opening formed thereon and disposed at a position shifted to a part of the multiple air blowers. Respective outputs of the multiple air blowers are different from each other according to respective positions of the multiple air blowers with respect to the opening.

Further, at least one embodiment of the present invention provides an image forming apparatus including the above-described cooling device, and multiple image forming devices to form an image on each surface thereof and to include multiple development devices and multiple charging devices. The cooling target corresponds to at least the multiple development devices. The multiple development devices include a black development device for developing black images and color development devices for developing respective color images. Each of the multiple image forming devices selectively forms a black-and-white image in a monochrome mode and a color image in a color mode. The output of the air blower to cool the black development device in the monochrome mode is smaller than the output thereof in the color mode. The outputs of the other air blowers to cool the respective color development devices in the monochrome mode are equal to the outputs thereof in the color mode.

Further, at least one embodiment of the present invention provides an image forming apparatus including the above-described cooling device and multiple image forming devices to form an image on each surface thereof and to include multiple development devices, multiple charging devices, and multiple image carriers corresponding to the multiple development devices. The cooling target corresponds to at least the multiple development devices. The multiple development devices and the multiple image carriers are included in multiple process cartridges detachably attached to the apparatus body thereof. Each of the multiple image forming devices selectively forms a black-and-white image in a monochrome mode and a color image in a color mode. The output of an air blower to cool the black development device in the monochrome mode is smaller than the output thereof in the color mode. The outputs of the other air blowers to cool the respective color development devices in the monochrome mode are equal to the outputs thereof in the color mode.

Further, at least one embodiment of the present invention provides an image forming apparatus including the above-described cooling device, an apparatus body, and multiple image forming devices to form an image on each surface thereof. The multiple development devices are included in multiple process cartridges detachably attached to the apparatus body thereof. The cooling target corresponds to the multiple development devices included in the multiple image forming devices. Each of the multiple image forming devices selectively forms a black-and-white image in a monochrome mode and a color image in a color mode. The output of an air blower to cool the black development device in the monochrome mode is smaller than the output thereof in the color mode. The outputs of the other air blowers to cool the respective color development devices in the monochrome mode are equal to the outputs thereof in the color mode.

Further, at least one embodiment of the present invention provides a cooling device including multiple air blowers to cool a cooling target, and a duct to connect with the multiple air blowers and to pass respective airflows generated by the multiple air blowers therethrough and to have an opening formed at a position facing a part of the multiple air blowers to pass the airflows from the multiple air blower therethrough. The multiple air blowers inflow the respective airflows in a previously determined direction. Airflows exhausted from each of the multiple air blowers at a high speed enter into respective different regions on the opening without interference with each other.

Further, at least one embodiment of the present invention provides an image forming apparatus including the above-described cooling device, and an image forming device to form an image on a recording medium and to serve as the cooling target to be cooled by the cooling device.

BRIEF DESCRIPTION OF THE DRAWINGS

A more complete appreciation of the invention and many of the advantages thereof will be obtained as the same becomes better understood by reference to the following detailed description when considered in connection with the accompanying drawings, wherein.

DETAILED DESCRIPTION

Figure 1:
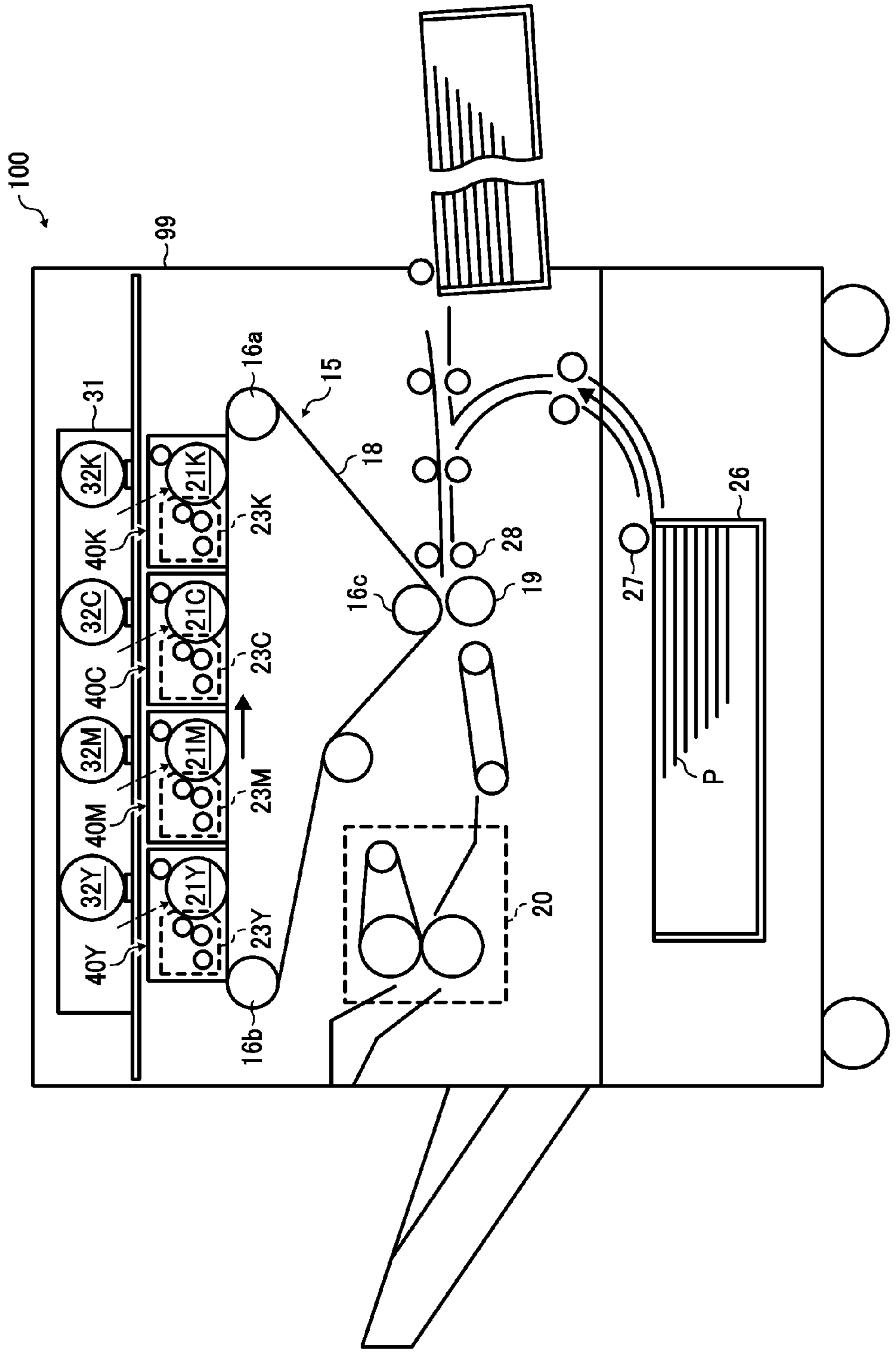
FIG. 1 is a diagram illustrating a schematic configuration of an image forming apparatus according to an embodiment of the present invention.

It will be understood that if an element or layer is referred to as being "on", "against", "connected to" or "coupled to" another element or layer, then it can be directly on, against, connected or coupled to the other element or layer, or intervening elements or layers may be present. In contrast, if an element is referred to as being "directly on", "directly connected to" or "directly coupled to" another element or layer, then there are no intervening elements or layers present. Like numbers referred to like elements throughout. As used herein, the term "and/or" includes any and all combinations of one or more of the associated listed items.

Spatially relative terms, such as "beneath", "below", "lower", "above", "upper" and the like may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements describes as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors herein interpreted accordingly.

Although the terms first, second, etc. may be used herein to describe various elements, components, regions, layers and/or sections, it should be understood that these elements, components, regions, layer and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present invention.

The terminology used herein is for describing particular embodiments and is not intended to be limiting of exemplary embodiments of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Descriptions are given, with reference to the accompanying drawings, of examples, exemplary embodiments, modification of exemplary embodiments, etc., of an image forming apparatus according to exemplary embodiments of the present invention. Elements having the same functions and shapes are denoted by the same reference numerals throughout the specification and redundant descriptions are omitted. Elements that do not demand descriptions may be omitted from the drawings as a matter of convenience. Reference numerals of elements extracted from the patent publications are in parentheses so as to be distinguished from those of exemplary embodiments of the present invention.

The present invention is applicable to any image forming apparatus, and is implemented in the most effective manner in an electrophotographic image forming apparatus.

In describing preferred embodiments illustrated in the drawings, specific terminology is employed for the sake of clarity. However, the disclosure of the present invention is not intended to be limited to the specific terminology so selected and it is to be understood that each specific element includes any and all technical equivalents that have the same function, operate in a similar manner, and achieve a similar result.

Referring now to the drawings, wherein like reference numerals designate identical or corresponding parts throughout the several views, preferred embodiments of the present invention are described.

As illustrated in FIG. 1, an image forming apparatus 100 includes an apparatus body 99.

The image forming apparatus 100 may be a copier, a facsimile machine, a printer, a multifunction peripheral or a multifunction printer (MFP) having at least one of copying, printing, scanning, facsimile, and plotter functions, or the like. According to the present embodiment, the image forming apparatus 100 is an electrophotographic color copier that forms color and monochrome toner images on recording media by electrophotography.

A cartridge container 31 is disposed at an upper part of the apparatus body 99. The cartridge container 31 includes four developer cartridges 32Y, 32M, 32C, and 32K. The developer cartridges 32Y, 32M, 32C, and 32K are disposed corresponding to yellow, magenta, cyan, and black and are detachably (replaceably) attached to the apparatus body 99.

An intermediate transfer unit 15 is disposed below the cartridge container 31. The intermediate transfer unit 15 includes three support rollers 16*a*, 16*b*, and 16*c* and an intermediate transfer belt 18.

The support rollers 16*a*, 16*b*, and 16*c* are wound about the intermediate transfer belt 18 of an endless loop functioning as an intermediate transfer member.

Image forming devices 40Y, 40M, 40C, and 40K are disposed facing the intermediate transfer belt 18. The image forming devices 40Y, 40M, 40C, and 40K correspond to respective colors (yellow, magenta, cyan, and black) and function as an image forming part as a whole. Each of the image forming devices 40Y, 40M, 40C, and 40K may include a primary transfer bias roller 17 and a secondary transfer roller 19 as illustrated in FIG. 2.

Each of the image forming devices 40Y, 40M, 40C, and 40K has a configuration and functions as an example of a process cartridge and is detachably attached with respect to the apparatus body 99.

The image forming devices 40Y, 40M, 40C, and 40K employ different single color toners, which are yellow (Y), magenta (M), cyan (C), and black (K) toners. Except for the colors of toners, the image forming units 40Y, 40M, 40C, and 40K have configurations identical to each other. Hereinafter, the units and components included in the apparatus body 99 of the image forming apparatus 100 are often referred to in a singular unit without suffix indicating toner colors, Y, M, C, and K, similar to FIG. 2. For example, the image forming units 40Y, 40M, 40C, and 40K may also be referred to as "the image forming unit 40".

Figure 2:
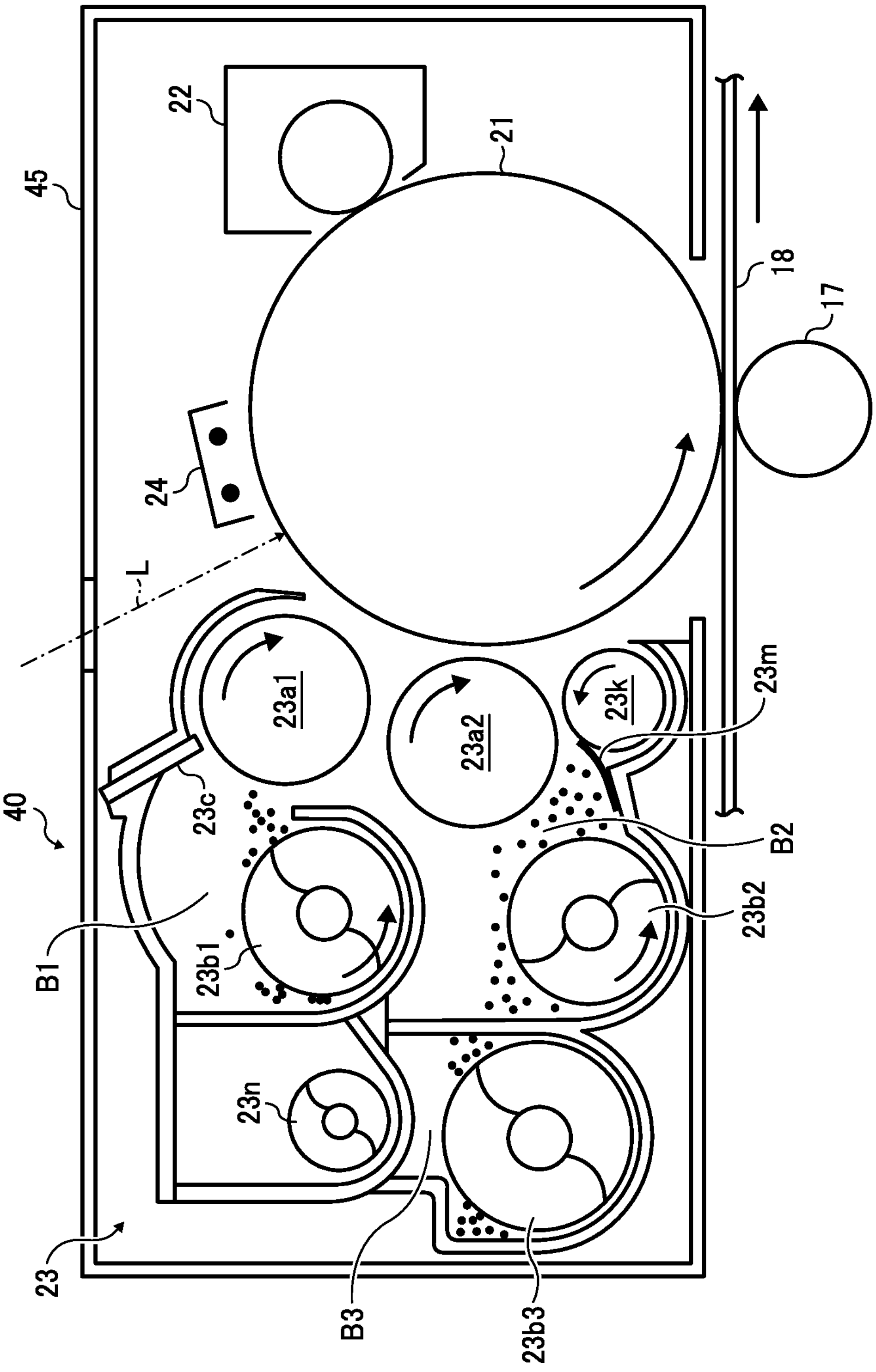
FIG. 2 is an enlarged cross-sectional view illustrating an image forming device included in the image forming apparatus of FIG. 1.

As illustrated in FIG. 2, the image forming device 40 integrally includes a photoconductor drum 21 functioning as an image carrier, and image forming units and components disposed around the photoconductor drum 21 in a unit case 45. The image forming units and components are a charging device 24, a development device 23, a cleaning device 22, an electric discharging device, and so forth. The unit case 45 functions as a unit body and represents the framework or frame of housing or casing provided in the image forming device 40. By assembling the photoconductor drum 21, the charging device 24, the development device 23, and the cleaning device 22 in the unit case 45 as an example of the process cartridge, replacement and safety maintenance service can be easier and operability of the image forming apparatus 100 can be enhanced.

In this embodiment, the image forming device 40 functioning as a process cartridge can be replaced as a whole. However, any other configurations of the process cartridge are also applicable. For example, a unit including the development device 23 and the photoconductor 8 can be applied to the present invention. Alternatively, a unit including the charging device 24, the development device 23, and the photoconductor drum 21 can be applied to the present invention.

Image forming processes, which are a charging process, an exposing process, a developing process, primary and secondary transferring processes, and a cleaning process, are performed on the photoconductor drum 21, so that respective single color toner images are formed on respective photoconductor drums 21Y, 21M, 21C, and 21K.

The photoconductor drums 21Y, 21M, 21C, and 21K are driven by a drive motor to rotate counterclockwise in FIG. 1. As illustrated in FIG. 2, the charging device 24 uniformly charges a surface of the photoconductor drum 21 in the charging process. The charging device 24 employs a scorotron system and includes charging wires and grid electrodes.

Then, an exposure device emits a laser light L to irradiate an outer circumferential surface of the photoconductor drum 21, so that an electrostatic latent image is formed in the exposing process.

The outer circumferential surface of the photoconductor drum 21 then reaches a position facing the development device 23 surrounded by a broken line in FIG. 1. At this position, the development device 23 develops the electrostatic latent image formed on the outer circumferential surface of the photoconductor drum 21 to a visible toner image in the developing process.

Followed by the developing process, the outer circumferential surface of the photoconductor drum 21 comes to a position facing the intermediate transfer belt 18 and the primary transfer bias roller 17 illustrated in FIG. 2. At this position, the toner images formed on the photoconductor drums 21 are transferred onto the intermediate transfer belt 18 in the primary transferring process. A small amount of residual toner remains on the outer circumferential surface of the photoconductor drum 21.

Thereafter, the outer circumferential surface of the photoconductor drum 21 comes to a position facing the cleaning device 22. At this position, the cleaning device 22 removes and collects the residual toner remaining on the outer circumferential surface of the photoconductor drum 21 in the cleaning process.

Finally, the outer circumferential surface of the photoconductor drum 21 reaches a position facing the electric discharging device. At this position, the electric discharging device removes residual potential remaining on the outer circumferential surface of the photoconductor drum 21.

Thus, a series of image forming processes performed on the photoconductor drum 21 is completed.

After the developing process, the intermediate transfer belt 18 that carries a composite toner image formed by sequentially overlaying the toner images formed on the photoconductor drums 21Y, 21M, 21C, and 21K reaches a position facing the secondary transfer roller 19. At this position, the intermediate transfer belt 18 is interposed between the support roller 16*c* that also serves as a secondary transfer backup roller and the secondary transfer roller 19 to form a secondary transfer nip area. Then, the composite four-color toner image formed on the intermediate transfer belt 18 is transferred onto a recording medium P that functions as a transfer sheet that is conveyed to the secondary transfer nip area. At this time, a small amount of residual toner that has not been transferred onto the recording medium P remains on the intermediate transfer belt 18. Thereafter, the intermediate transfer belt 18 comes to a position facing an intermediate transfer belt cleaning device. At this position, the intermediate transfer belt cleaning device removes and collects residual toner remaining on the intermediate transfer belt 18.

Thus, a series of image transferring processes performed on the intermediate transfer belt 18 is completed.

Here, the recording medium P conveyed to the secondary transfer nip area is fed from a sheet feeding device 26 disposed at a lower part of the apparatus body 99 and conveyed via a sheet feed roller 27 and a registration roller pair 28. Specifically, the sheet feeding device 26 accommodates a stack of multiple recording media including the recording medium P. As the sheet feed roller 27 is rotated counterclockwise, the recording medium P placed on top of the stack is fed toward the registration roller pair 28.

The recording medium P conveyed to the registration roller pair 28 is stopped as a nip are of the registration roller pair 28 that is stopped rotating at that stage. At the nip area of the registration roller pair 28, the recording medium P is adjusted to be free from skew and other inconvenience for further conveyance. By synchronizing with movement of the color toner image formed on the intermediate transfer belt 18, the registration roller pair 28 is rotated, so that the recording medium P is conveyed toward the secondary transfer nip area.

Thus, the color toner is transferred onto the recording medium P.

The recording medium P that has received the color toner image at the secondary transfer nip area is then conveyed to the fixing device 20. In the fixing device 20, the color toner formed on the recording medium P is fixed to the recording medium P by application of heat by a fixing belt and pressure by a pressure roller. Thereafter, the recording medium P is discharged as an output image to the outside of the apparatus body 99 of the image forming apparatus 100.

Thus, a series of image forming processes in the image forming apparatus 100 is completed.

Next, a description is given of a configuration and functions of the development device 23.

As illustrated in FIG. 2, the development device 23 includes a first development roller **23*a*1, a second development roller 23*a*2, a first conveyance screw 23*b*1, a second conveyance screw 23*b*2, a third conveyance screw 23*b*3, a doctor blade 23*c*, a carrier collection roller 23*k*, a scraper 23*m*, and a fourth conveyance screw 23*n*. The development device 23** also includes three developer conveying parts B1, B2, and B3 to form respective channels to convey and circulate developer contained therein.

The first development roller **23*a*1 and the second development roller 23*a*2 include a sleeve having a cylindrical body. The sleeve is formed by conductive resin such as aluminum, brass, and stainless and is rotated by a rotation drive mechanism in a clockwise direction. Magnets are fixedly provided in each sleeve of the first development roller 23*a*1 and the second development roller 23*a*2 to generate a magnetic field so that the developer is napped on a circumferential surface of the sleeve. The carriers in the developer are napped along chain-shaped lines of magnetic force in a normal direction generated by the magnets. Then, toner is attached to the charged carriers napped in a chain shape to form a magnetic brush. As the sleeve rotates, the magnetic brush is conveyed in the same direction as the sleeve. Consequently, at a first development region where the first development roller 23*a*1 and the photoconductor drum 21 face each other and a second development region where the second development roller 23*a*2 and the photoconductor drum 21 face each other, the toner of the two-component developer is attracted to the electrostatic latent image formed on the photoconductor drum 21**. Accordingly, the electrostatic latent image is developed to a visible toner image.

The doctor blade **23*c* is disposed at an upstream side of a development region to regulate the amount of developer carried on the first development roller 23*a*1 to a given amount. The doctor blade 23*c*** according to the present embodiment includes a plate formed by a non-magnetic metallic material (and a soft magnetic metal material) such as SUS316 and XM7 and having a thickness of approximately 2 mm.

The carrier collection roller **23*k* is disposed downstream from the second development roller 23*a*2 in a rotation direction thereof and facing the photoconductor drum 21. The carrier collection roller 23*k* includes a cylindrical body formed of stainless steel or the like and contains magnets in the cylindrical body to generate a given magnetic field. The magnetic field is generated to collect carriers that are floated and moved from the development device 23 and attached to the photoconductor drum 21. The carrier collection roller 23*k* is driven to rotate counterclockwise in FIG. 2**.

The scraper **23*m* is disposed in contact with the carrier collection roller 23*k***.

Each of the first conveyance screw **23*b*1, the second conveyance screw 23*b*2, and the third conveyance screw 23*b*3 has a spiral screw on a shaft thereof. The first conveyance screw 23*b*1, the second conveyance screw 23*b*2, and the third conveyance screw 23*b*3 agitate and mix the developer accommodated in the development device 23 while circulating the developer in a longitudinal direction thereof, which is a vertical direction to the sheet of FIG. 2**).

The first conveyance screw **23*b*1 is disposed facing the first development roller 23*a*1 in the first developer conveying part B1. The first conveyance screw 23*b*1 conveys the developer in the horizontal direction to supply the developer on the first development roller 23*a*1**.

The second conveyance screw **23*b*2 is disposed in the second developer conveying part B2. The second conveyance screw 23*b*2 is disposed downstream from the first conveyance screw 23*b*1 in a developer conveying direction and facing the second development roller 23*a*2. The second conveyance screw 23*b*2 conveys the developer in the horizontal direction. The developer is forcedly separated from the second development roller 23*a*2** by a developer separating polarity after the developing process in the horizontal direction.

Similar to the first development roller **23*a*1, the second development roller 23*a*2, and the photoconductor drum 21, the first conveyance screw 23*b*1 and the second conveyance screw 23*b*2** are disposed such that the respective rotation shafts thereof are substantially horizontal.

The third conveyance screw **23*b*3 is disposed in the third developer conveying part B3. The third conveyance screw 23*b*3 is disposed obliquely with respect to the horizontal direction to contact a downstream side of the conveyance channel defined by the second conveyance screw 23*b*2 and an upstream side of the conveyance channel defined by the first conveyance screw 23*b*1 linearly. The third conveyance screw 23*b*3 transports the developer conveyed by the second conveyance screw 23*b*2 to the upstream side of the conveyance channel of the first conveyance screw 23*b*1**.

At the same time, the third conveyance screw **23*b*3 transports the developer, which is circulated from the conveyance channel of the first conveyance screw 23*b*1 via a developer dropping channel, to the upstream side of the conveyance channel of the first conveyance screw 23*b*1**.

The conveyance channel of the first conveyance screw **23*b*1 in the first developer conveying part B1, the conveyance channel of the second conveyance screw 23*b*2 in the second developer conveying part B2, and the conveyance channel of the third conveyance screw 23*b*3** in the third developer conveying part B3 are isolated by partitions.

The downstream side of the second developer conveying part B2 and the upstream side of the third developer conveying part B3 are connected via a first relay part. The downstream side of the third developer conveying part B3 and the upstream side of the first developer conveying part B1 are connected via a second relay part. The downstream side of the first developer conveying part B1 and the upstream side of the third developer conveying part B3 are connected via the developer dropping channel.

With the above-described configuration, the first developer conveying part B1, the second developer conveying part B2, and the third developer conveying part B3 form a developer circulating channel that circulates the developer in the longitudinal direction in the development device 23.

It is to be noted that the third developer conveying part B3 includes a magnetic sensor. Based on results of toner concentration detected by the magnetic sensor, the developer having a given toner concentration is supplied from the developer cartridge 32 toward the development device 23.

Here, the development device 23 according to the present embodiment includes an air exhausting port on the wall of the first developer conveying part B1. The air exhausting port is used to exhaust a part of the developer contained in the development device 23 to the outside of the development device 23 (to a developer storing container). As the developer is supplied from the cartridges 32Y, 32M, 32C, and 32K to the development device 23, the amount of developer in the development device 23 can increase. When the surface of the developer conveyed to the development device 23 reaches beyond a given height of the developer contained in the development device 23, the air exhausting port transports an excess amount of developer to the developer storing container. The developer that is conveyed through the air exhausting port is transported by the fourth conveyance screw 23*n*, and is further transported to the developer storing container. Thus, carriers contaminated and deteriorated by maternal resin of toner and external additive are discharged to the outside of the development device 23 automatically, thereby reducing degradation of image quality with age.

As described above, the image forming apparatus 100 includes four image forming devices 40 (i.e., the image forming devices 40Y, 40M, 40C, and 40K) which includes the development device 23 and the charging device 24. The image forming devices 40 are heated by other devices such as the fixing device 20 and generate heat by itself. Therefore, for example, when rotary drive mechanisms of rotary bodies such as the first conveyance screw 23*b*1, the second conveyance screw 23*b*2, and the third conveyance screw 23*b*3 generate frictional heat, the temperature in the image forming device 40 increases to cause problems and inconveniences. If the temperature in the development device 23 of the image forming device 40 becomes substantially high, toner in the developer accommodated in the development device 23 can melt or coagulate or cause other problems, which is likely to cause image defect. To prevent the development device 23 of the image forming device 40 from increasing the temperature, the air around the rotary drive mechanisms of the development device 23 may need to be cooled by airflow.

Further, in the charging device 24 having a non-contact charging system such as a scorotron system, ozone can be generated due to high voltage discharging and/or foreign material such as toner conveyed from an adjacent area of the charging device 24 can adhere a discharging wire to reduce the life. To prevent these inconveniences, the airflow may need to be generated around the charging device 24 proactively.

Further, cooling an area adjacent to a charging device having a contact charging system having a charging roller can lower the temperature in the charging device, and therefore changes an electrical resistance value of the charging roller. By so doing, the charging device can maintain the function to uniformly charge a target, and therefore can prevent occurrence defect images.

For the above-described reasons, the development device 23 and the charging device 24 of the image forming device 40 are selected as target devices to be cooled in the present embodiment.

The image forming apparatus 100 includes the intermediate transfer unit 15 and the image forming devices 40Y, 40M, 40C, and 40K to perform two image forming modes, which are a monochrome mode to produce black-and-white images and a color mode to produce color images. In response to user's instructions issued via an operation display panel or a server or personal computer connected to the image forming apparatus 100, the image forming apparatus 100 executes printing in the monochrome mode or the color mode. A known technique such as the technique disclosed in Japanese Patent Application Publication No. JP 2012-018335-A, for example, is used as a contact/separation unit to switch the monochrome mode and the color mode. JP 2012-018335-A discloses a contact separation mechanism (72) to selectively separate an intermediate transfer member with respect to each image carrier as shown in FIG. 1.

Figure 3:
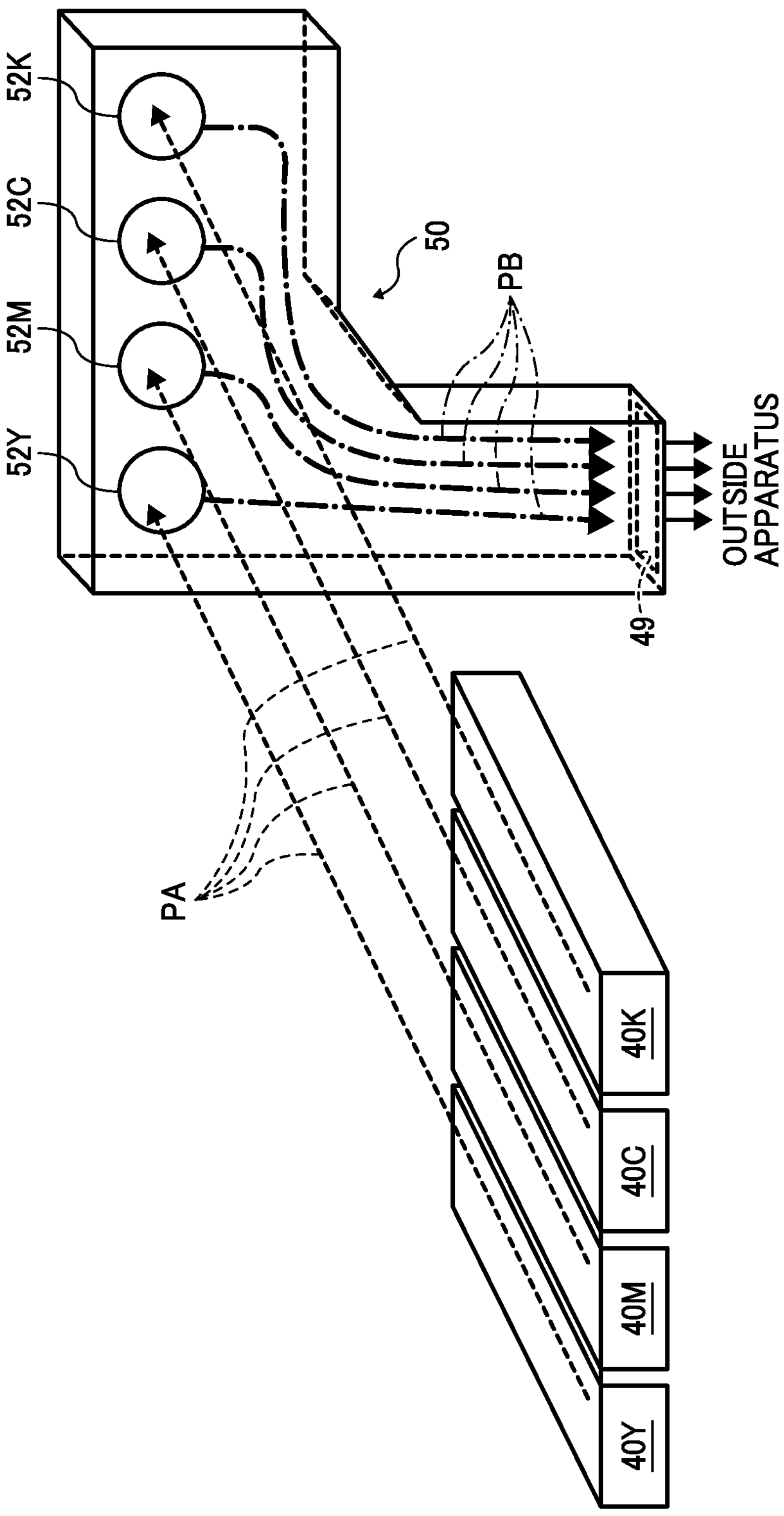
FIG. 3 is a perspective view illustrating positions, connections, and airflow channels between the image forming devices and corresponding fans provided to an air collection duct.

A description is given of a relation of connection of the image forming devices 40Y, 40M, 40C, and 40K and an air collection duct 50, with reference to FIG. 3.

FIG. 3 is a perspective view illustrating positions, connections, and airflow paths between the image forming devices 40Y, 40M, 40C, and 40K and corresponding fans 52Y, 52M, 52C, and 52K provided to the air collection duct 50.

Viewing from the front side of the image forming apparatus 100, the air collection duct 50 is attached to the rear side of the image forming devices 40Y, 40M, 40C, and 40K. The air collection duct 50 functions as a duct unit provided in the apparatus body 99 illustrated in FIG. 1. The fans 52Y, 52M, 52C, and 52K function as air blowers provided in the air collection duct 50 are disposed facing the image forming devices 40Y, 40M, 40C, and 40K, respectively. The air collection duct 50 is hollow inside to attach and connect the fans 52Y, 52M, 52C, and 52K and communicate and flow the airflow exhausted from the fans 52Y, 52M, 52C, and 52K. The air collection duct 50 also has a single outlet port 49 that functions as an opening at a lower part thereof. As illustrated in FIG. 3, the outlet port 49 of the air collection duct 50 is disposed at a position to be shifted to a part of the fans 52Y, 52M, 52C, and 52K. Specifically, the outlet port 49 is arranged so as to be shifted to the lower left portion of FIG. 3 when viewed from the front side of the air collection duct 50 in FIG. 3. The air collection duct 50 is integrally formed of an appropriate resin so as to have a configuration lighter in weight and less expensive in cost.

The fans 52Y, 52M, 52C, and 52K include a common electric motor such as a DC motor and a servo motor that has the same maximum output. The fans 52Y, 52M, 52C, and 52K may be a multi-blade fan that is a centrifugal blower such as a sirocco fan, an axial blower such as an axial fan, and the like.

The fans 52Y, 52M, 52C, and 52K are driven to rotate to draw air into the air collection duct 50 via airflow paths PA indicated by broken lines in FIG. 3 so that heat generated in respective temperature increasing portions of the image forming devices 40Y, 40M, 40C, and 40K corresponding to the fans 52Y, 52M, 52C, and 52K are taken therefrom. The fans 52Y, 52M, 52C, and 52K are also driven to rotate to flow the air after being introduced to the air collection duct 50 in airflow paths PB indicated by dot-dashed lines in the air collection duct 50 of FIG. 3 and to exhaust the air to the outside thereof from the outlet port 49 arranged at the lower part of the air collection duct 50. It is to be noted that the airflow path PA and the airflow path PB are channels through which the air flows.

As long as the fans 52Y, 52M, 52C, and 52K are driven to rotate as described above, the configuration of the fans 52Y, 52M, 52C, and 52K is not limited to the sirocco fan and the axial fan. For example, a configuration having a mixed flow type blower can be applied to the present invention. Further, instead of the configuration in which the fans 52Y, 52M, 52C, and 52K introduce air to the air collection duct 50, a configuration in which the fans 52Y, 52M, 52C, and 52K blow air to the image forming devices 40Y, 40M, 40C, and 40K can be applied.

The fan 52Y corresponding to the image forming device 40Y is disposed immediately above the outlet port 49 and the fan 52K corresponding to the image forming device 40K is disposed at a farthest position from the outlet port 49. Specifically, the fans 52Y, 52M, 52C, and 52K are disposed at different positions with respect to the outlet port 49. In other words, the fans 52Y, 52M, 52C, and 52K have different distances between the outlet port 49 and the corresponding airflow path PB. The fan 52Y corresponding to the image forming device 40Y has the shortest airflow path PB to the outlet port 49. The fan 52M corresponding to the image forming device 40M and the fan 52C corresponding to the image forming device 40C have the second and third shortest airflow paths PB, respectively, to the outlet port 49. The fan 52K corresponding to the image forming device 40K has the longest airflow path PB to the outlet port 49.

It is to be noted that the outlet port 49 of the air collection duct 50 may be have an ozone toner filter.

A detailed configuration of the connections to communicate the image forming devices 40Y, 40M, 40C, and 40K and the corresponding fans 52Y, 52M, 52C, and 52K of the air collection duct 50 is the same as the configuration of FIG. 1 of JP 2010-032577-A.

Figure 4:
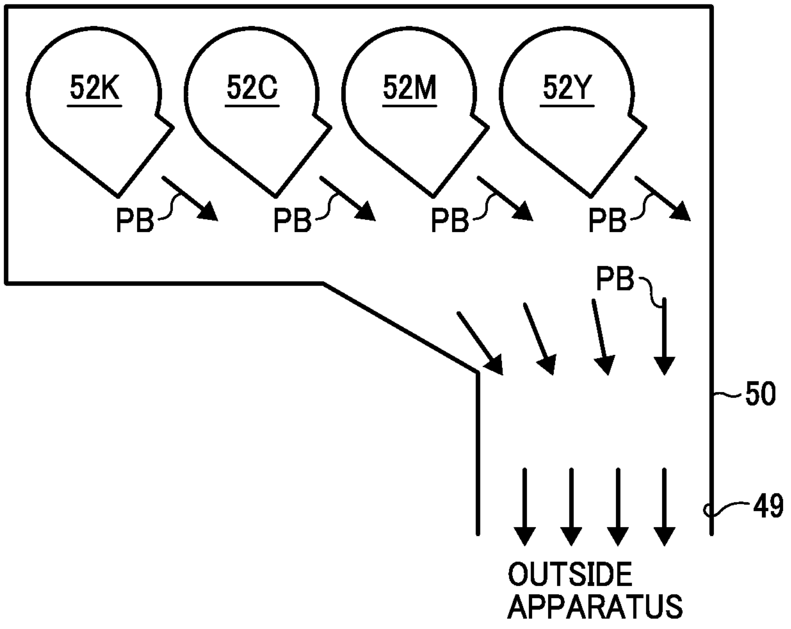
FIG. 4 is a rear side view of the air collection duct viewed from the rear side of an apparatus body of the image forming apparatus of FIG. 1.

A description is given of airflow paths PB and functions of the fans 52Y, 52M, 52C, and 52K, with reference to FIG. 4.

FIG. 4 is a rear side view of the air collection duct 50 viewed from the rear side of the apparatus body 99.

The fans 52Y, 52M, 52C, and 52K are driven to intake air through the respective airflow paths PA provided in the image forming devices 40Y, 40M, 40C, and 40K and distribute the air to the air collection duct 50. With this function, air pressure inside the air collection duct 50 becomes higher than outside air, and therefore the air in the air collection duct 50 is introduced to the outside thereof. Consequently, cooling target parts, which are the temperature increasing portions, in the development device 23 and the charging device 24 of each of the image forming devices 40Y, 40M, 40C, and 40K are cooled. From viewpoints of the exhaust efficiency, respective air flowing directions of the fans 52Y, 52M, 52C, and 52K are basically directed to the outlet port 49.

The respective air flowing directions of the fans 52Y, 52M, 52C, and 52K are preferably determined optimally. However, due to limitation of costs, a common plan having the same air flowing directions is generally employed. Since the airflow paths PB of the image forming devices 40Y, 40M, 40C, and 40K have different lengths (for example, a fan is disposed farther from the outlet port 49 and another fan is disposed closer to the outlet port 49), it is difficult to design the airflows.

Figure 5:
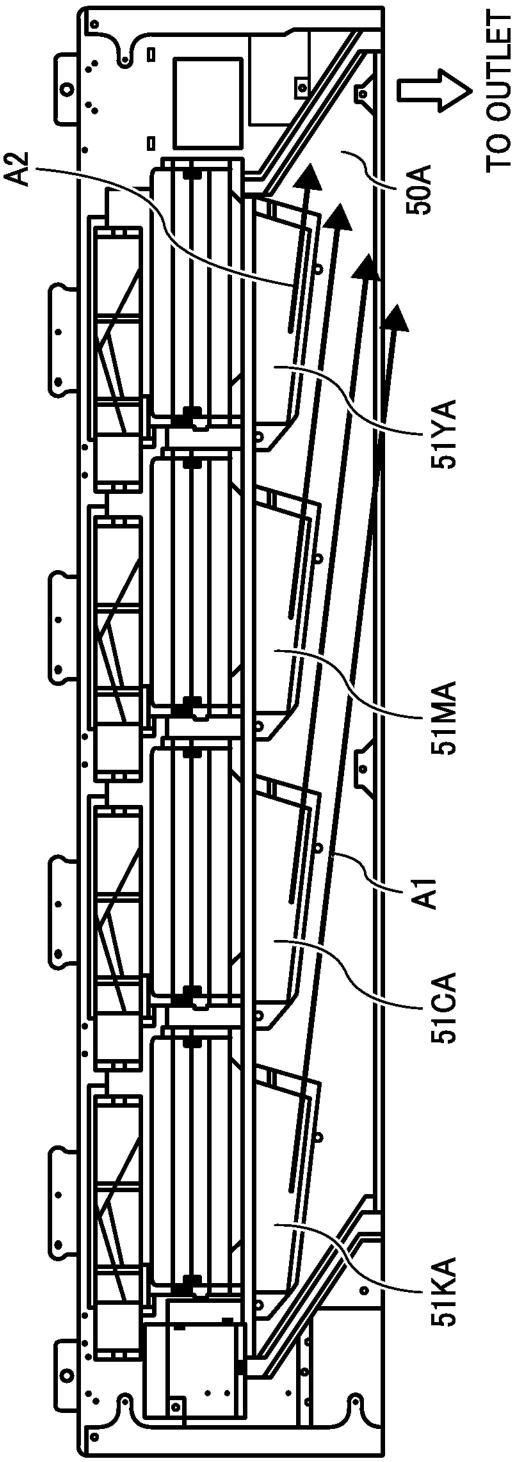
FIG. 5 is a diagram illustrating a comparative air collection duct.

As an example of a comparative configuration, FIG. 5 illustrates a comparative air collection duct 50A.

The air collection duct 50A includes air blowing fans 51YA, 51MA, 51CA, and 51KA. In the air collection duct 50A of the comparative configuration, a resistance of airflow that is exhausted by the air blowing fan 51YA disposed close to an air blowing port and a resistance of airflow that is blown by the air exhausting fan 51KA disposed farther than the air exhausting fan 51YA with respect to the air exhausting port are different due to difference lengths of respective airflow paths. Consequently, the air exhausting fan 51YA and the air exhausting fan 51KA have different amounts of airflow introduced from respective cooling target parts according to the different airflow resistances.

Specifically, as illustrated in FIG. 5, the airflow resistance of an airflow path A1 of the air exhausting fan 51KA that is disposed far from the air exhausting port (in other words, the length of airflow from the air exhausting port is relatively long) is greater than the airflow resistance of an airflow path A2 of the air exhausting fan 51YA that is disposed close to the air exhausting port (in other words, the length of airflow from the air exhausting port is relatively short). Therefore, even if the air exhausting fans 51KA and 51YA have the same output specification, the amount of airflow from the air exhausting fan 51KA disposed farther from the air exhausting port is smaller than the amount of airflow from the air exhausting fan 51YA disposed closer to the air exhausting port. Consequently, the cooling target parts may be cooled unevenly.

Different from the above-described inconvenience, different amounts of airflow exhausted from fans in a cooling device may be required because the cooling device is susceptible to heat generated by a fixing device disposed in the vicinity of the cooling device, for example. Therefore, the cooling device is designed to meet the demand of an area where the airflow is most required.

The configuration of the air collection duct 50 according to an embodiment of the present invention can control the amount of airflow of each fan 52.

Figure 6:
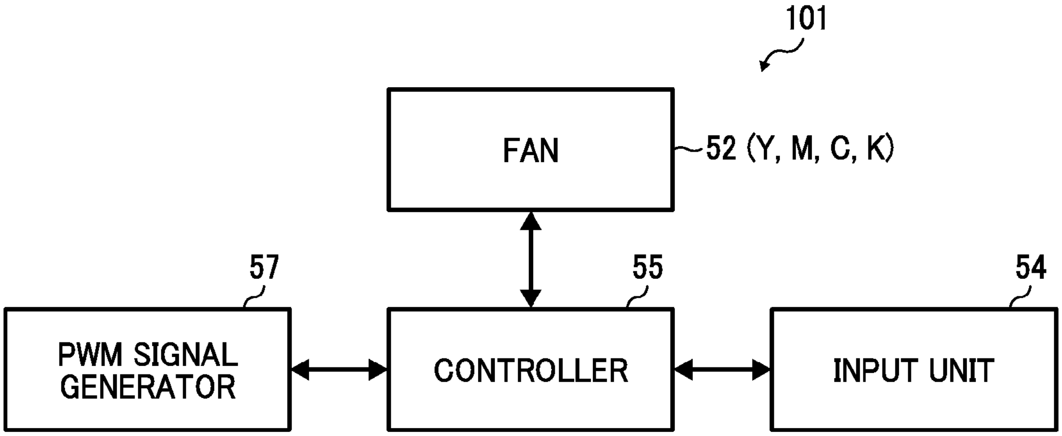
FIG. 6 is a block diagram illustrating a main configuration of a controller mechanism.

A description is given of a main configuration of a controller mechanism 101 according to the present embodiment, with reference to FIG. 6.

FIG. 6 is a block diagram illustrating the main configuration of the controller mechanism 101. As illustrated in FIG. 6, the controller mechanism 101 includes the fans 52Y, 52M, 52C, and 52K, an input part 54, a controller 55, and a PWM (Pulse Width Modulation) signal generator 57. The fans 52Y, 52M, 52C, and 52K serve as drive units to be controlled. The controller 55 corresponds to a microprocessor.

The input part 54 corresponds to an operation display panel that is mounted on an optional part of the apparatus body 99 of the image forming apparatus 100 illustrated in FIG. 1. The operation display panel is provided with various keys including a mode setting key and a display part formed by a liquid crystal display (LCD). The operation display panel includes a known configuration (such as a touch panel) which is used to send operation instructions to various devices and parts of the image forming apparatus 100 and to recognize the operation state visually or audibly. The input part 54 is operated by user to input a signal related to image information such as the number set for prints or copies and a monochrome mode signal or a color mode signal generated with a mode setting key and to transmit the instructions to the controller 55.

It is to be noted that, in a case in an image forming apparatus that does not have an operation display panel thereon, the input part can be an external server or personal computer that is connected to communicate with the image forming apparatus.

The PWM signal generator 57 functions as an electric signal generator to generate electric signals to control outputs of the fans 52Y, 52M, 52C, and 52K. Specifically, the PWM (Pulse Width Modulation) signal generator 57 is a signal generator that includes a circuit in which a duty cycle of a pulse wave to be given to a motor drive circuit of a drive (electric) motor of each of the fans 52Y, 52M, 52C, and 52K is changed and modulated. Further, a duty cycle represents the ratio of the pulse duration or width to the total period of a signal when a periodic pulse wave is formed.

It is to be noted that the control block diagram is not limited to FIG. 6 but is also applied to a configuration including a PWM signal generator for each of the fans 52Y, 52M, 52C, and 52K.

The controller 55 may be configured to control the whole devices, unit, and components of the image forming apparatus 100. However, to make the description of the controller easy, FIG. 6 shows a configuration closely related to the present embodiment. The controller 55 is provided with a CPU, a ROM, a RAM, and a timer therein and includes a microcomputer having a configuration in which the CPU, the ROM, the RAM, and the timer are connected each other via a signal bus.

The CPU functions as a control unit to control the four fans 52Y, 52M, 52C, and 52K and to transmit each instruction signal to each motor drive circuit based on a signal from the operation display panel of the image forming apparatus 100 and an operation program called by the ROM.

The ROM previously stores operation programs and related data therein, which are occasionally called by the CPU. An example of the related data is the timing chart shown in FIG. 7 and the duty cycles described in Tables 1 and 2.

The RAM stores calculation results of the CPU temporarily. The RAM also stores time information various keys on the operation display panel, time information measured by the timers, and data signals input from various sensors.

Figure 7:
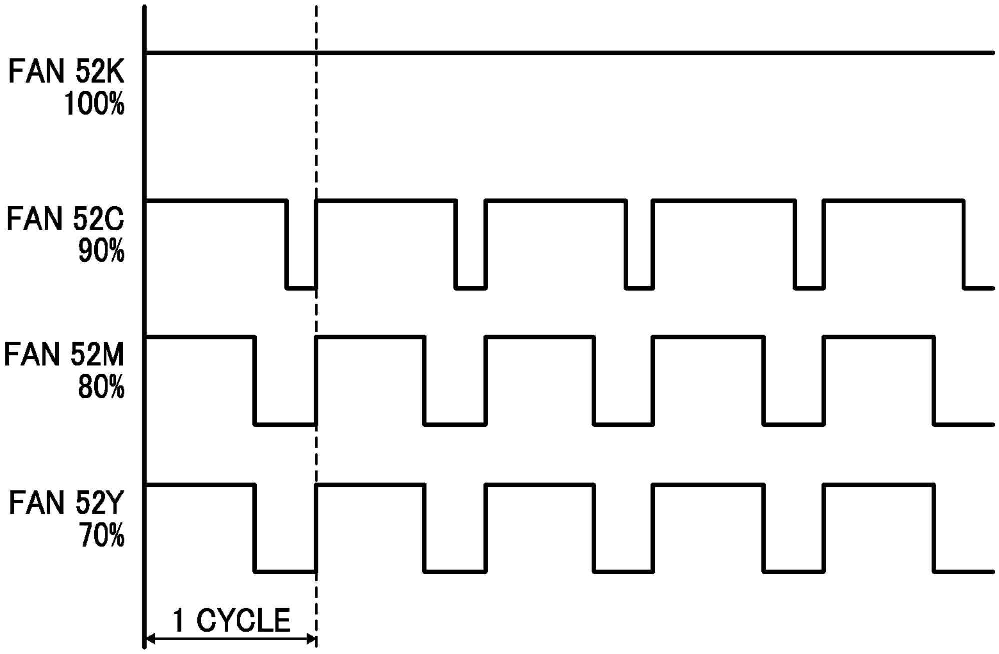
FIG. 7 is a timing chart showing rise timings and fall timings of PWM pulses in control of the fans.

A description is given of details of control of the fans 52Y, 52M, 52C, and 52K as illustrated in FIG. 6, with reference to FIG. 7.

FIG. 7 is a timing chart showing rise timings and fall timings of the PWM pulses in control of the fans 52Y, 52M, 52C, and 52K as illustrated in FIGS. 4 and 6. In FIG. 6, 1 cycle corresponds to 1 period of 1 pulse.

Regarding a case in which heat generated by the fixing device 20 is not considered, the fan 52Y that is disposed closest to the outlet port 49 of the air collection duct 50 has a 70% duty cycle (hereinafter, a duty cycle is simply referred to as a “duty”). The 70% duty is based on the setting of an amount of air flow that is needed to cool the development device 23 (hereinafter, an amount of airflow is simply referred to as an “airflow amount” occasionally).

As the position of the fan 52 becomes far from the outlet port 49, the duty is controlled to change such that the fan 52M has a 80% duty, the fan 52C has a 90% duty, and the fan 52K that is located farthest from the outlet port 49 has a 100% duty. Thus, the duties of the fans 52Y, 52M, 52C, and 52K are not controlled by feedback control based on results obtained by an airflow speed detector that detects a speed of airflow but are controlled by outputs previously set by the PWM signal generator 57 based on instruction issued by the controller 55. The previously set outputs are previously obtained by tests using the image forming apparatus 100 including the image forming devices 40Y, 40M, 40C, and 40K and the air collection duct 50 and stored and set in the ROM and other control components.

As described above, in the present embodiment, as the positions of the fans 52Y, 52M, 52C, and 52K illustrated in FIG. 4 become far from (as the airflow paths PB become far from) the outlet port 49 of the air collection duct 50, the outputs of the fans 52Y, 52M, 52C, and 52K are set to be greater. By so doing, even with respect to deviation of airflow amount caused by airflow path resistance due to differences in length of the airflow paths PB in the air collection duct 50, sufficient airflow amounts can be introduced to the image forming devices 40Y, 40M, 40C, and 40K, thereby cooling the image forming devices 40Y, 40M, 40C, and 40K in a balanced manner.

As described above, in the present embodiment, not only the above-described effect but also the following basic effect can be achieved. That is, the outputs of the fans 52Y, 52M, 52C, and 52K can be changed according to each position of the fans 52Y, 52M, 52C, and 52K with respect to the outlet port 49 of the air collection duct 50. With this operation, regardless of the positions of the fans 52Y, 52M, 52C, and 52K with respect to the outlet port 49 of the air collection duct 50, the development devices 23 and the charging devices 24 of the image forming devices 40 can be cooled in a balanced manner without unevenness therebetween.

A description is given of another configuration of the air collection duct 50 with reference to Table 1.

The present configuration is identical to the configuration according to the above-described embodiment, except that the present configuration controls outputs of the fans 52Y, 52M, 52C, and 52K by an image forming mode input to the controller 55 from the input part 54 illustrated in FIG. 6

The positions of the fans 52Y, 52M, 52C, and 52K in the air collection duct 50 shown in FIG. 7 are identical to those shown in FIG. 4. The duties in the color mode shown in Table 1 below are same as the duties in the timing chart shown in FIG. 7.

TABLE 1

| | Monochrome Mode | Color Mode |
|---|---|---|
| Fan 52K | 90% Duty | 100% Duty |
| Fan 52C | 10% Duty | 90% Duty |
| Fan 52M | 10% Duty | 80% Duty |
| Fan 52Y | 10% Duty | 70% Duty |

In the monochrome mode, the image forming device 40K for forming a black image operates while the other image forming devices 40Y, 40M, and 40C do not. Therefore, the fan 52K operates to cool the image forming device 40K. At this time, when the fan 52K is mainly operated, it becomes difficult to increase the inner pressure of the air collection duct 50, compared to when the fans 52Y, 52M, 52C, and 52K operates to cool the image forming devices 40Y, 40M, 40C, and 40K. Therefore, the output of the fan 52K can be lower compared to the output in the color mode. It is to be noted that, if the fans 52Y, 52M, and 52C are completely stopped, the airflow introduced by the fan 52K may come into spaces of the fans 52Y, 52M, and 52C. To avoid this inconvenience, the fans 52Y, 52M, and 52C are controlled to be output at an approximately 10% duty that can prevent a backward flow toward the fans 52Y, 52M, and 52C.

Figure 8:
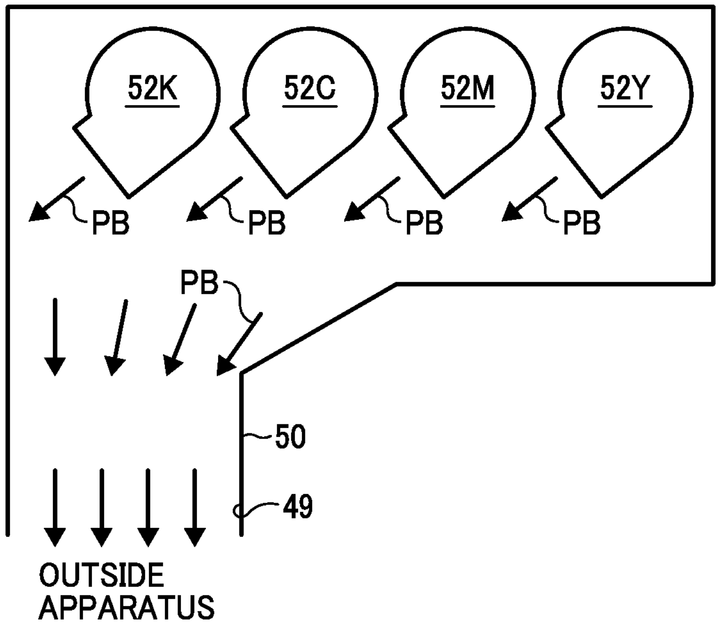
FIG. 8 is a rear side view of the positions and the airflow paths of the fans of the air collection duct according to an embodiment of the present invention, viewed from the back side of the apparatus body.

A description is given of yet another configuration of the air collection duct 50 based on the above-described embodiment, with respect to FIG. 8 and Table 2.

FIG. 8 is a rear side view of the positions and the airflow paths of the fans 52Y, 52M, 52C, and 52K of the air collection duct 50 according to the present configuration, viewed from the rear side of the apparatus body 99.

In this configuration, the fan 52K of the image forming device 40K for forming black images is disposed closest to the outlet port 49 of the air collection duct 50. Table 2 shows control of the fan 52K in this state.

TABLE 2

| | Monochrome Mode | Color Mode |
|---|---|---|
| Fan 52K | 60% Duty | 70% Duty |
| Fan 52C | 10% Duty | 80% Duty |
| Fan 52M | 10% Duty | 90% Duty |
| Fan 52Y | 10% Duty | 100% Duty |

In the color mode, since the image forming devices 40Y, 40M, 40C, and 40K are fully operated, the fans 52Y, 52M, 52C, and 52K are controlled to increase the respective outputs as the position of the fans 52Y, 52M, 52C, and 52K become far from the output port 49, which is same as the previously described configuration.

By contrast, in the monochrome mode, same as in the previously described configuration, the fan 52K corresponding to the operating image forming device 40K is controlled to provide a high output and the fans 52Y, 52M, and 52C corresponding to the respective image forming devices 40Y, 40M, and 40C are controlled to provide low outputs. In this configuration, since the operating forming device 40K is disposed closest to the outlet port 49, the fan 52K may not need to provide the high output as the fan 52K in the previously described configuration does.

Accordingly, by disposing the image forming device that operates both in the monochrome mode and the color mode to be closest to the outlet port 49, the duty of the fan 52K in the monochrome mode in the present configuration can be smaller than the duty of the fan 52K in the previously described configuration, thereby contributing to energy saving.

A description is given of control of the fans 52Y, 52M, 52C, and 52K provided in the air collection duct 50, taking in consideration of heat generated from the fixing device 20. The above-described configurations do not show the control of heat from the fixing device 20.

The airflow having heat that is generated in the fixing device 20 moves upward then along the intermediate transfer belt 18 from the left side in FIG. 1, and is transmitted to the image forming device 40Y. Therefore, the image forming device 40Y that is disposed at the leftmost side of the apparatus body 99 of the image forming apparatus 100 is mostly affected by the heated airflow from the fixing device 20. As the positions of the image forming devices 40Y, 40M, 40C, and 40K are shifted to the right side, the image forming devices 40Y, 40M, 40C, and 40K are not affected by the heat generated by the fixing device 20.

Here, the outputs of the fans 52Y, 52M, 52C, and 52K are added according to the amount of heat generated by the fixing device 20 affecting the corresponding image forming devices 40Y, 40M, 40C, and 40K.

For example, an extra 20% duty is added to the fan 52Y that corresponds to the image forming device 40Y disposed at the leftmost side of the apparatus body 99 of the image forming apparatus 100 and an extra 10% duty is added to the fan 52M that corresponds to the image forming device 40M and is disposed next to the fan 52Y. When adding the extra output, the output of the fan 52 is set to a value less than a 100% duty. For example, the fan 52Y in the color mode of Table 2 has a 100% duty when the fan 52Y is not affected by the heat generated by the fixing device 20. Therefore, the outputs of the fans 52M, 52C, and 52K are set to be a 100% duty by adding the respective extra outputs to the output values in the color mode of Table 2. Further, the output of the fan 52Y that corresponds to the image forming device 40Y disposed at the leftmost side of the image forming apparatus 100 (disposed at an extremely upward side of the airflow path through which the heat from the fixing device 20 is transported) is set to a 100% duty. Based on the output of the fan 52Y, the duties of the fans 52M, 52C, and 52K can be set. At this time, the duties of the fans 52M, 52C, and 52K are set to be the same as the values shown in Tables 1 and 2.

Figure 9:
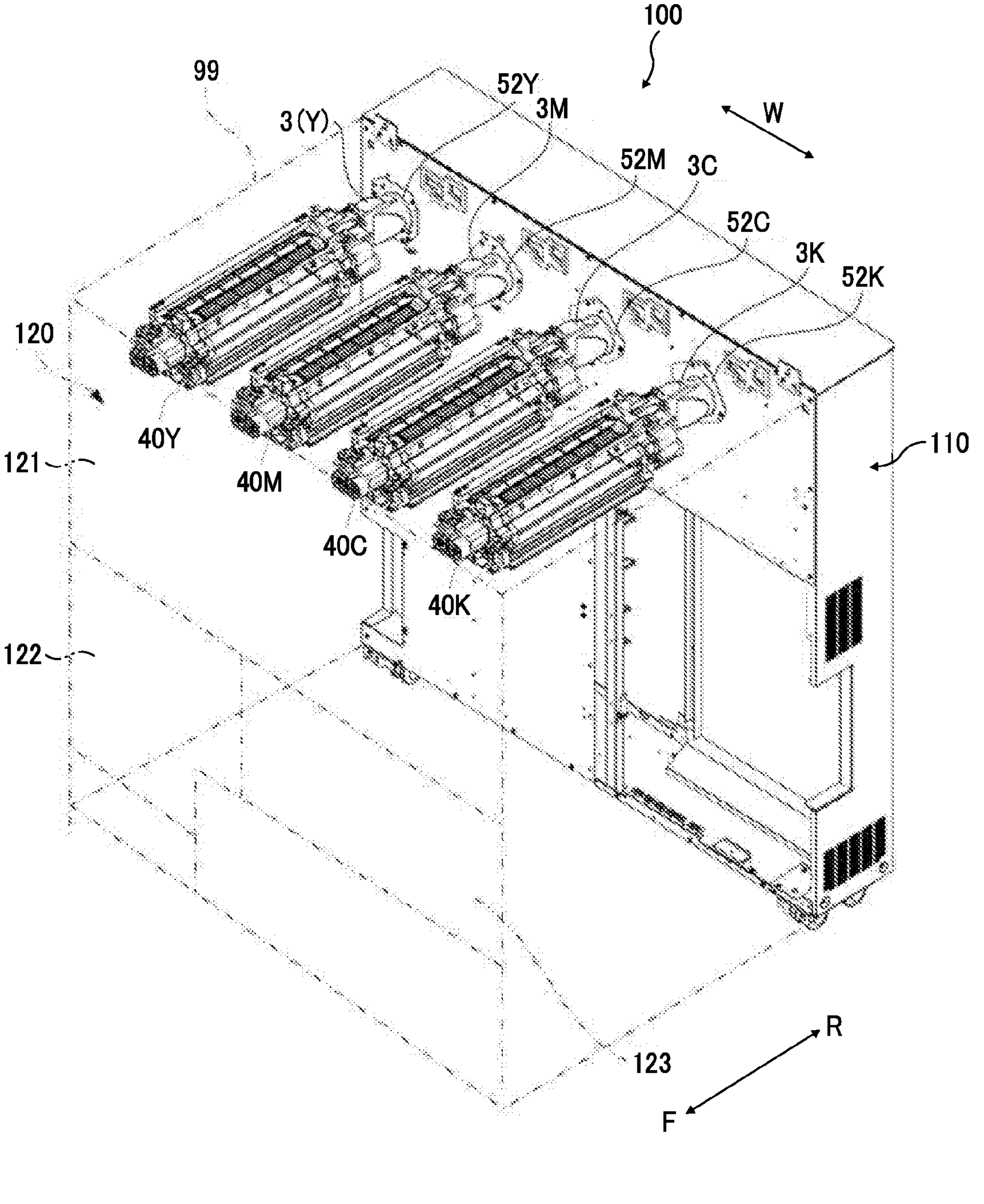
FIG. 9 is a perspective view illustrating another configuration of an inside of the image forming apparatus.

FIG. 9 is a perspective view illustrating another configuration of an inside of the image forming apparatus 100.

In FIG. 9, the apparatus body 99 of the image forming apparatus 100 further includes a rear face unit 110 and a front cover 120 in a box having a cuboid shape.

It is to be noted that "F" indicates a front side where an operator stands for operation and "R" indicates a rear side that is opposite to the front side in FIG. 9.

The image forming devices 40Y, 40M, 40C, and 40K functioning as cooling target members are disposed between the rear face unit 110 and the front cover 120 in the apparatus body 99 of the image forming apparatus 100. In the image forming apparatus 100, the image forming devices 40Y, 40M, 40C, and 40K are cooled by intaking air from the front cover 120 and exhausting the air from the rear face unit 110, so that an increase in temperature of the image forming devices 40Y, 40M, 40C, and 40K is reduced.

A description is given of the front cover 120 from which the air is introduced.

Figure 10:
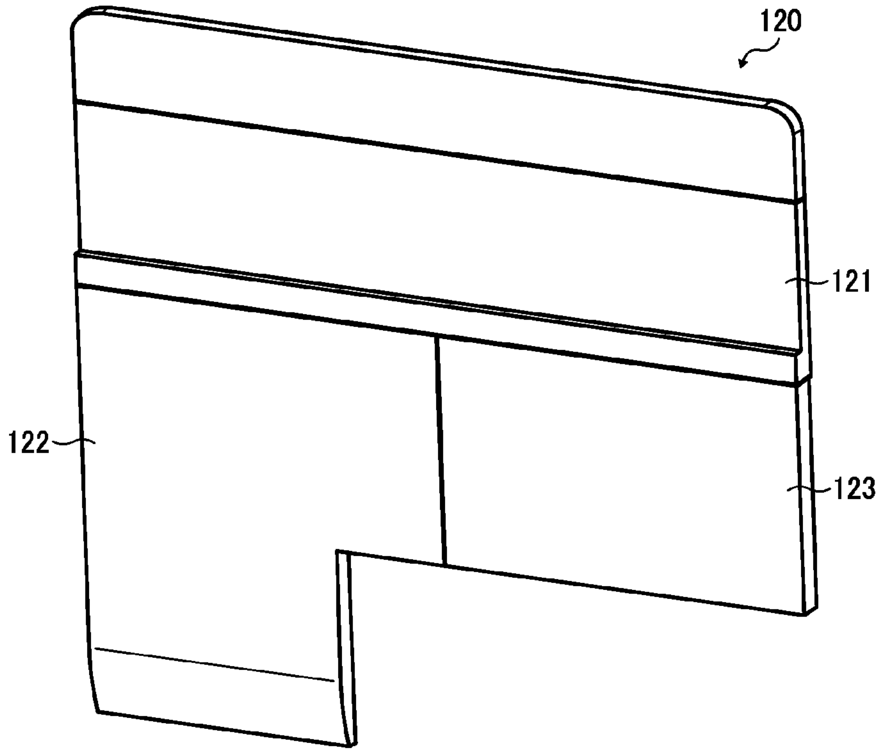
FIG. 10 is a perspective view illustrating a front cover of the image forming apparatus of FIG. 9.
Figure 11:
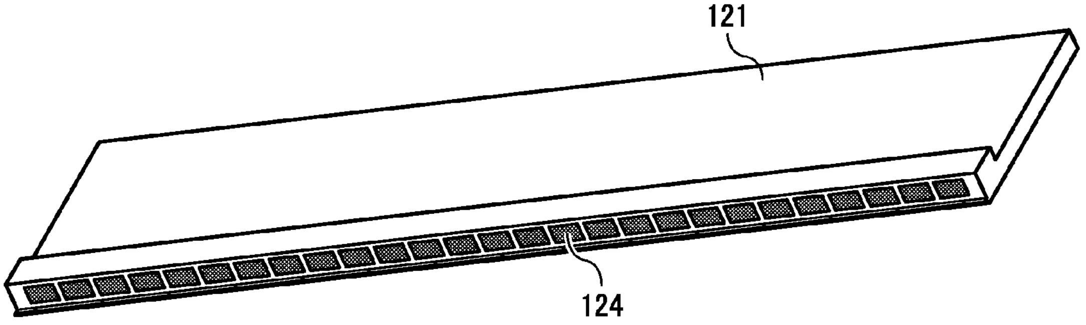
FIG. 11 is a perspective view illustrating air intake ports provided to the front cover.
Figure 12:
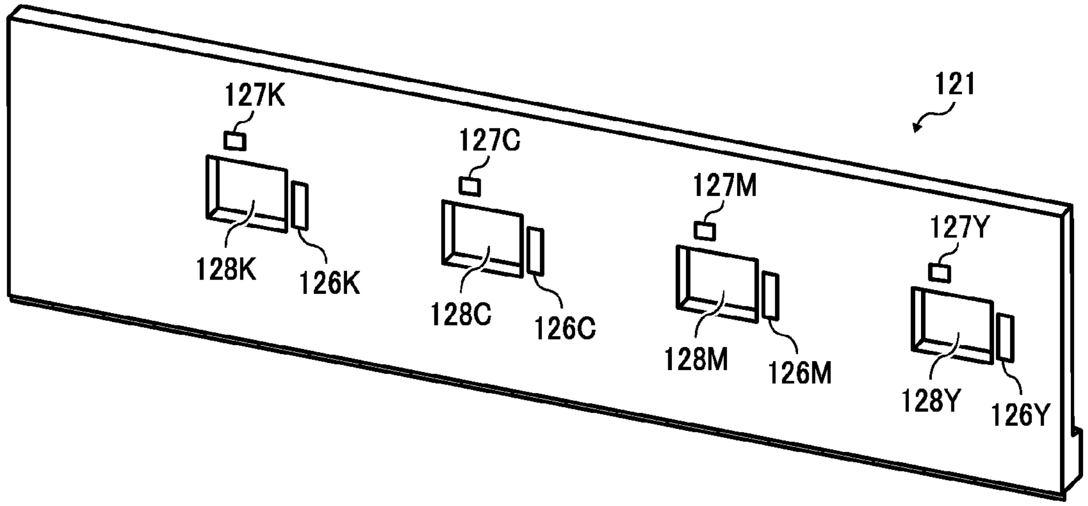
FIG. 12 is a perspective view illustrating airflow ports formed on the front cover.
Figure 13:
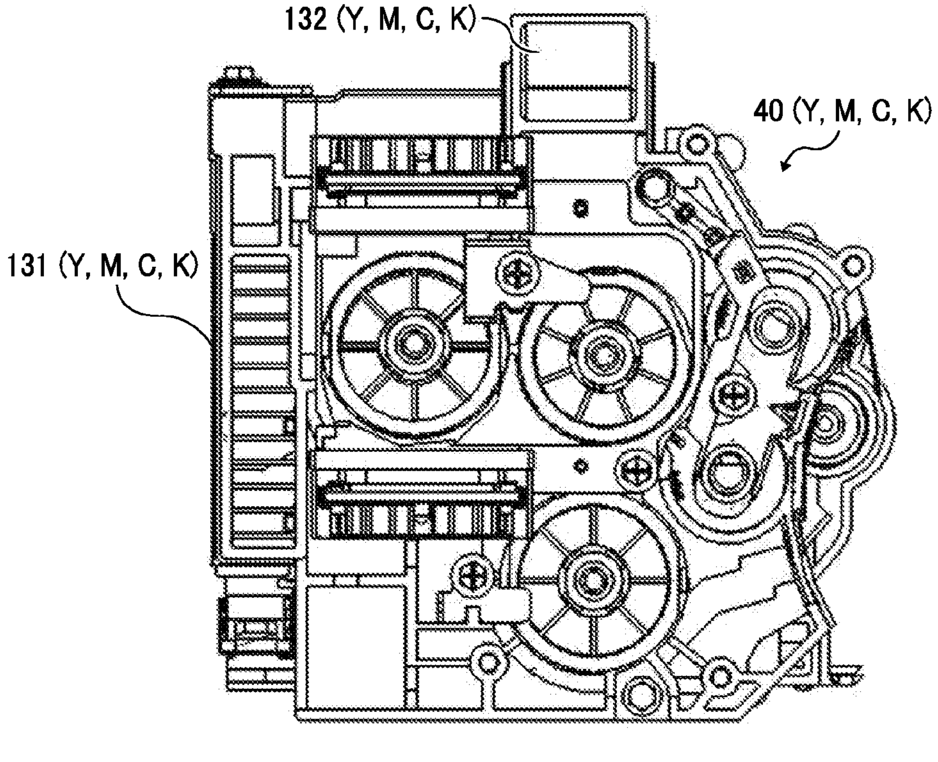
FIG. 13 is a front view illustrating a configuration of image forming devices of the image forming apparatus.

FIG. 10 is a perspective view illustrating the front cover 120 of the image forming apparatus 100. FIG. 11 is a perspective view illustrating air intake ports 124 provided to the front cover 120. FIG. 12 is a perspective view illustrating airflow ports 126Y, 126M, 126C, 126K, 127Y, 127M, 127C, and 127K formed on the front cover 120. FIG. 13 is a diagram illustrating a configuration of the image forming devices 40Y, 40M, 40C, and 40K.

The front cover 120 includes a fixed panel 121 and open close panels 122 and 123. The open close panels 122 and 123 are openable and closable. By opening the open close panels 122 and 123, the user can access to the inside of the image forming apparatus 100 for replacing consumed parts and/or removing a jammed sheet or sheets.

As illustrated in FIG. 11, the multiple air intake ports 124 are provided at a lower end of the fixed panel 121.

As illustrated in FIG. 12, the airflow ports 126Y, 126M, 126C, and 126K and the air flow ports 127Y, 127M, 127C, and 127K are formed on an inside wall of the fixed panel 121 to communicate with the air intake port 124 inside the fixed panel 121. The airflow ports 126Y, 126M, 126C, 126K, 127Y, 127M, 127C, and 127K of the fixed panel 121 are connected to air intake ports 131Y, 131M, 131C, 131K, 132Y, 132M, 132C, and 132K of the image forming devices 40Y, 40M, 40C, and 40K, respectively, as illustrated in FIG. 13. With this configuration, air is introduced to the image forming devices 40Y, 40M, 40C, and 40K.

It is to be noted that the respective configurations of the image forming devices 40Y, 40M, 40C, and 40K are identical to each other. Further, as illustrated in FIG. 12, the fixed panel 121 further includes recesses 128Y, 128M, 128C, and 128 formed on the inside wall thereof. The recesses 128Y, 128M, 128C, and 128K are provided to prevent interference by the image forming devices 40Y, 40M, 40C, and 40K.

A description is given of the rear face unit 110.

Figure 14:
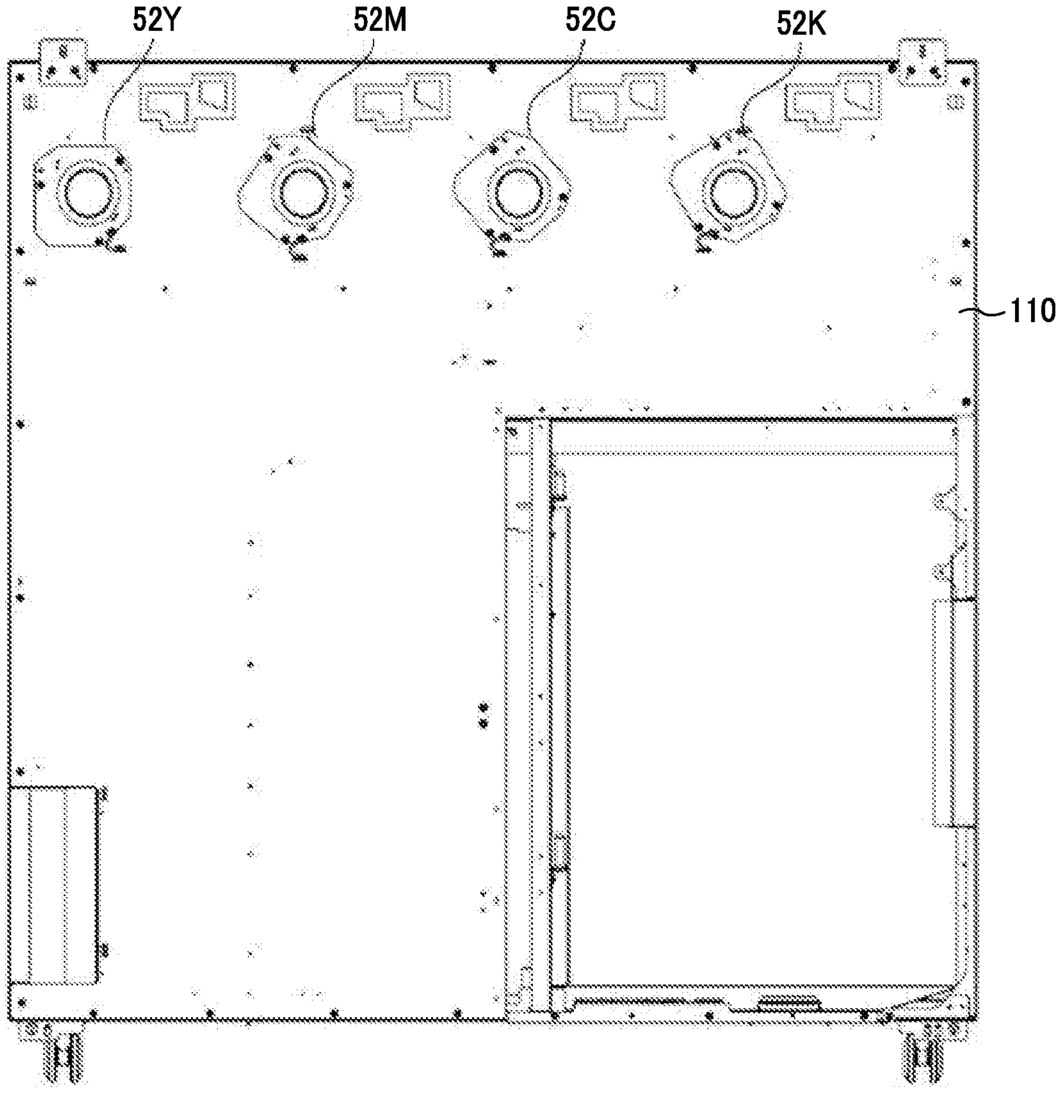
FIG. 14 is a front view illustrating a rear face unit of the image forming apparatus with the image forming devices and relay airflow paths being removed.
Figure 15:
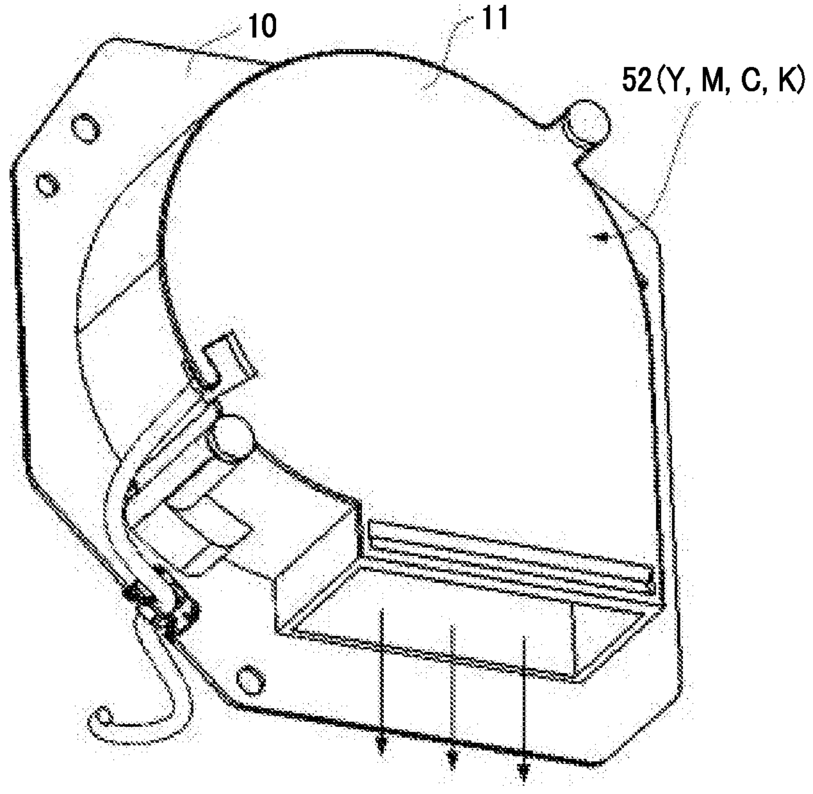
FIG. 15 is a perspective view illustrating the fan as an air blower of the image forming apparatus.
Figure 16:
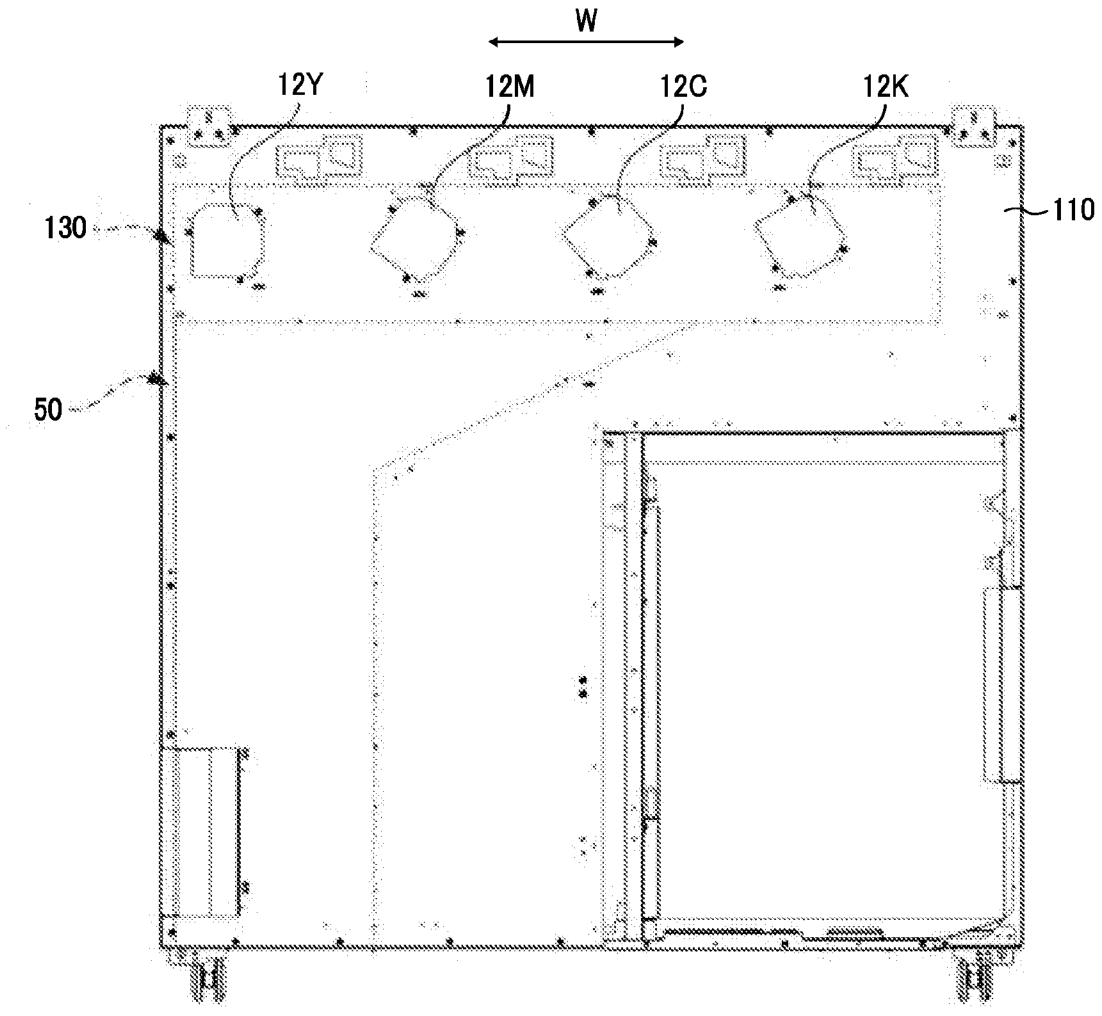
FIG. 16 is a front view illustrating the rear face unit of the image forming apparatus with the fans being removed.

FIG. 14 is a front view illustrating the rear face unit 110 of the image forming apparatus 100 with the image forming devices 40Y, 40M, 40C, and 40K and relay airflow paths 3Y, 3M, 3C, and 3 removed. FIG. 15 is a perspective view illustrating the fan 52 as an air blower of the image forming apparatus 100. FIG. 16 is a front view illustrating the rear face unit 110 of the image forming apparatus 100 with the fans 52M, 52C, and 52K removed.

The image forming devices 40Y, 40M, 40C, and 40K are connected to the relay airflow paths 3Y, 3M, 3C, and 3K, respectively. The image forming devices 40Y, 40M, 40C, and 40K are also connected to the fans 52Y, 52M, 52C, and 52K arranged in the relay airflow paths 3Y, 3M, 3C, and 3K, respectively. The fans 52Y, 52M, 52C, and 52K are disposed inside the rear face unit 110.

As described above, outside air to cool the image forming devices 40Y, 40M, 40C, and 40K is introduced through the fixed panel 121. The outside air that has taken the heat from the image forming devices 40Y, 40M, 40C, and 40K is sent to the fans 52Y, 52M, 52C, and 52K, respectively, via the relay airflow paths 3Y, 3M, 3C, and 3K, respectively. Regardless of the positions of the image forming devices 40Y, 40M, 40C, and 40K, respective communication ports of the fans 52Y, 52M, 52C, and 52K and the relay airflow paths 3Y, 3M, 3C, and 3K have shapes identical to each other (a circular shape in the present embodiment). The common communication ports are used for the fans 52 (i.e., the fans 52Y, 52M, 52C, and 52K).

As illustrated in FIG. 15, each of the fans 52Y, 52M, 52C, and 52K includes a holding member 10 and an air flow device 11. The airflow exhausted from the air flow device 11 is blown in a direction indicated by arrows illustrated in FIG. 15.

It is to be noted that a centrifugal air flowing unit such as a sirocco fan or other various fans can be applied as the air flowing device 11.

Figure 17:
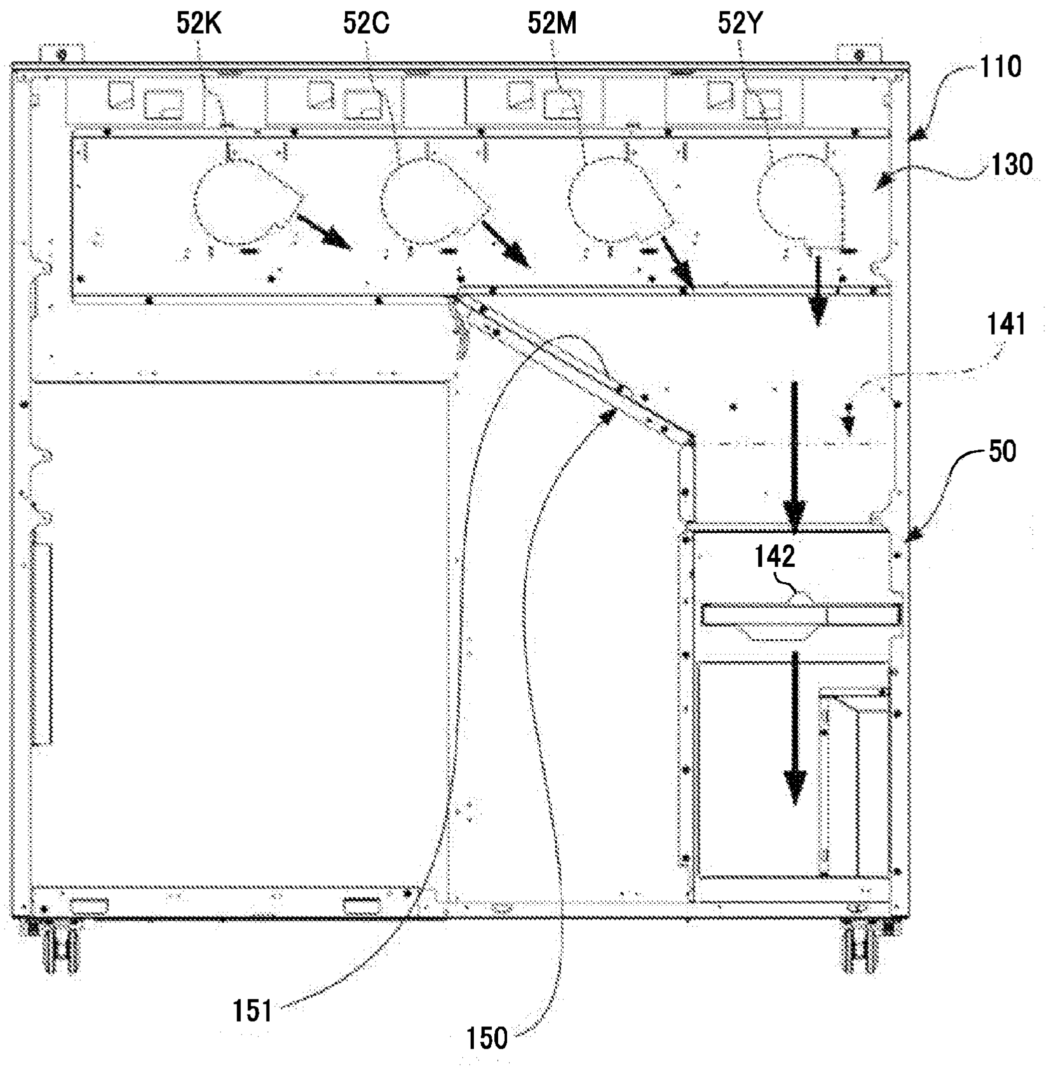
FIG. 17 is a front view illustrating the rear face unit of the image forming apparatus.

As illustrated in FIGS. 16 and 17, are mounted on the rear face unit 110 includes an air blower distributing device 130 and the air collection duct 50. In the air blower distributing device 130, the fans 52Y, 52M, 52C, and 52K are aligned along a width direction W thereof. In the air collection duct 50, a collected airflow path collects the airflow exhausted from the fans 52Y, 52M, 52C, and 52K.

As illustrated in FIG. 17, an opening 141 is provided at a lower end of the air collection duct 50. The airflow exhausted from the fans 52Y, 52M, 52C, and 52K comes through the opening 141. The opening 141 has a rectangular edge and is disposed to face the fan 52Y. Further, an airflow guide part 150 is provided between the air blower distributing device 130 and the opening 141 of the air collection duct 50. The airflow guide part 150 includes a slope 151 that tapers off from the air blower distributing device 130 to the opening 141.

As illustrated in FIG. 16, the fans 52Y, 52M, 52C, and 52K are distributed to respective attaching ports 12Y, 12M, 12C, and 12K that is formed on the air blower distributing device 130.

The attaching ports 12Y, 12M, 12C, and 12K have identical shapes with different attaching angles. With the attaching ports 12Y, 12M, 12C, and 12K, the fans 52Y, 52M, 52C, and 52K are attached as slanted downwardly by respective given angles (for example, the fan 52Y: 90 degrees, the fan 52M: 60 degrees, the fan 52C: 45 degrees, and the fan 52K; and K: 35 degrees). As illustrated in FIG. 17, with this configuration, the airflow exhausted from the air flow device 11 of the fan 52 (i.e., the fans 52Y, 52M, 52C, and 52K) is blown through the opening 141 with the respective angles according to the distance from the opening 141 of the image forming device 40 (i.e., the image forming devices 40Y, 40M, 40C, and 40K). At this time, the airflows exhausted from the fan 52 at high speed flow without being interfered by different air incoming area of the opening 141.

As illustrated in FIG. 17, the airflow from the opening 141 via the airflow guide part 150 to the air collection duct 50 passes a filter member 142 that sucks ozone, odor, VOC and the like from the air collection duct 50. Then, the airflow is exhausted from the bottom surface of the image forming apparatus 100 to the outside thereof.

It is to be noted that the flat surface including the edge of the opening 141 is indicated by a two-dot chain line in FIG. 17.

Figure 18:
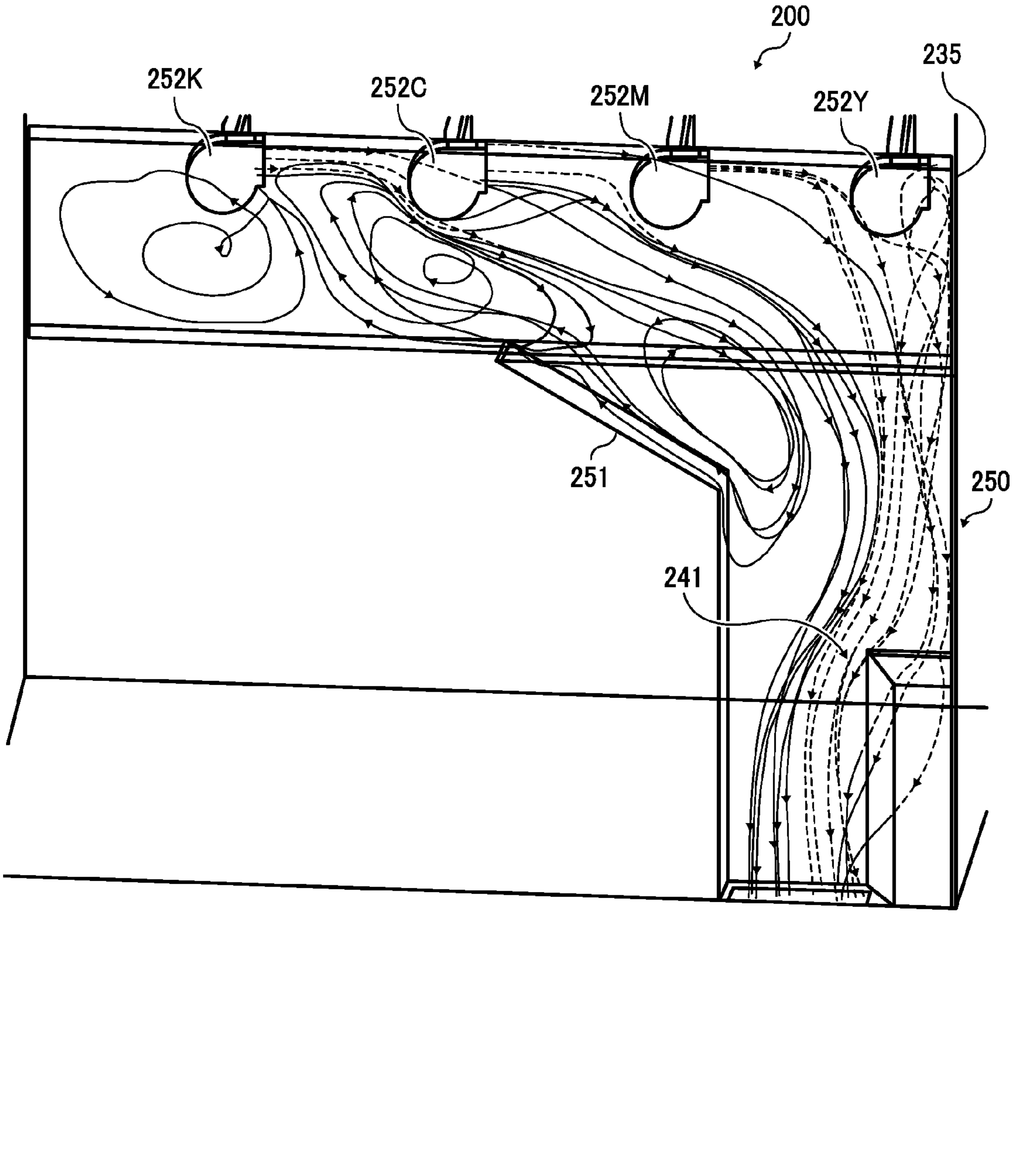
FIG. 18 is shows results of simulation of airflows in an air collection duct inside an image forming apparatus according to an example of an embodiment of the present invention.
Figure 19:
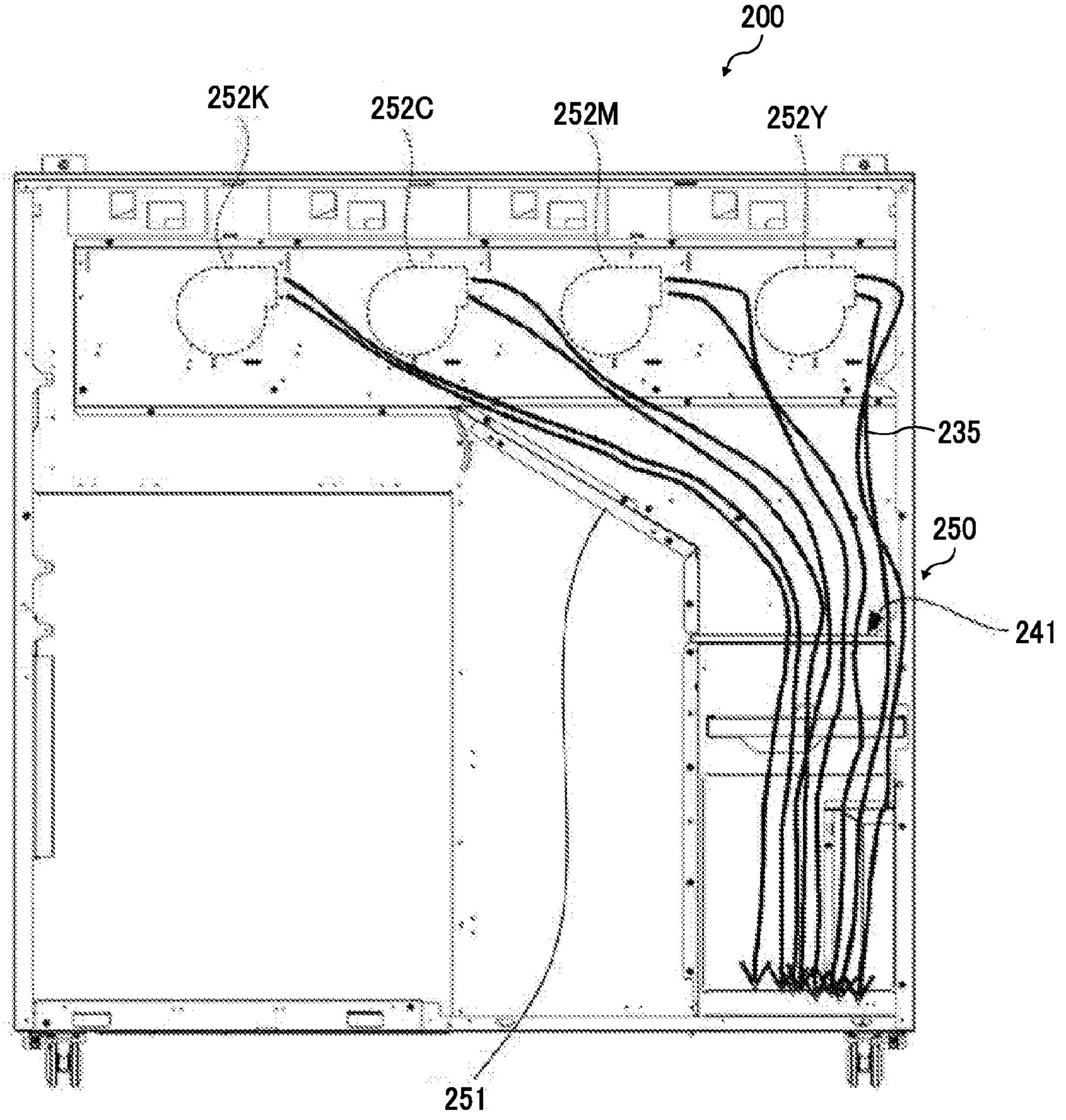
FIG. 19 is shows the result of simulation of airflows at high speed in FIG. 18.

A description is given of the flow of air exhausted from the fans 52Y, 52M, 52C, and 52K, with respect to a comparative configuration shown in FIGS. 18 and 19.

FIGS. 18 and 19 show the comparative configuration in which the airflows exhausted from the fans 52Y, 52M, 52C, and 52K direct to the same direction (a horizontal direction). Specifically, FIG. 18 shows results of simulation of airflows in an air collection duct 250 inside an image forming apparatus 200. FIG. 19 shows the result of simulation of airflows at high speed in FIG. 18. In FIG. 18, solid arrow lines represent path lines of air flowing at low speed and dotted arrow lines represent path lines of air flowing at high speed.

In this comparative configuration, the airflows exhausted from the fans 52Y, 52M, 52C, and 52K interfere each other to stagnate the flow. Therefore, the airflow efficiency is degraded. The interference of airflows in the dotted arrow lines in FIGS. 18 and 19 occur due to the following reasons.

The airflow exhausted from a fan 252Y hits a planar member 235 immediately after the air exhaust from the fan 252Y. Consequently, the pressure loss is caused, and the airflow efficiency is reduced. Further, the airflow exhausted from the fan 252Y is exhausted to a direction different from an opening 241 that is disposed at a lower portion of the air collection duct 250 of the image forming apparatus 200. Therefore, the direction of the airflow is changed to cause the energy loss, thereby reducing the airflow efficiency. Furthermore, the airflows exhausted from the fans 252M, 252C, and 252K in a lateral direction (i.e., a right direction in FIGS. 18 and 19) is different from the airflow that is exhausted from the fan 252Y in a direction toward the opening 241. Therefore, the airflow from the fan 252Y and the airflows from the fans 252M, 252C, and 252K interfere with each other.

Since the airflow from the fan 252M hits the fan 252Y, the pressure loss is caused and the air efficiency is reduced. Further, the airflow from the fan 252M is blown in a direction different from the direction toward the opening 241 that is disposed at the lower portion of the air collection duct 250 of the image forming apparatus 200. Therefore, the change of course of the airflow causes the energy loss, thereby reducing the airflow efficiency. Furthermore, the airflow from the fan 252M directs to a different direction from the airflows from the fan 252C and the fan 252K in the lateral direction (the right direction in FIGS. 18 and 19), the airflow from the 252Y in the lateral direction (i.e., a left direction in FIGS. 18 and 19), and the airflow from the fan 252M in the direction toward the opening 241. Therefore, the airflow from the fan 252M interferes with the airflows from the fans 252Y, 252C, and 252K. The airflow from the fan 252Y hits a planar member 235. With this action, the airflow that flows to the left direction is generated.

Further, the airflow from the fan 252C hits the fan 252M to lose the pressure and degrade the airflow efficiency. Furthermore, the airflow from the fan 252C is exhausted to the direction different from the opening 241 that is disposed at the lower portion of the air collection duct 250 of the image forming apparatus 200. Therefore, the direction of the airflow from the fan 252C is changed to cause the energy loss, thereby reducing the airflow efficiency. Furthermore, the airflow from the fan 252C directs to a different direction from the airflow from the fan 252K in the lateral direction (the right direction in FIGS. 18 and 19), the airflows from the fans 252Y and 252M in the lateral direction (i.e., a left direction in FIGS. 18 and 19), and the airflow from the fan 252C in the direction toward the opening 241. Therefore, the airflow from the fan 252C interferes with the airflows from the fans 252Y, 252M, and 252K. Here, the airflow from the fan 252Y hits the planar member 235 and the airflow from the 252M hits the fan 252Y. Therefore, the airflow in the left direction is generated.

The airflow from the fan 252K hits the fan 252C to lose the pressure and degrade the airflow efficiency. Further, the airflow from the fan 252K is exhausted or blown to the direction different from the opening 241 that is disposed at the lower portion of the air collection duct 250 of the image forming apparatus 200. Therefore, the direction of the airflow from the fan 252K is changed to cause the energy loss, thereby reducing the airflow efficiency. Furthermore, the airflow from the fan 252K directs to a different direction from the airflows from the fans 252Y, 252M, and 252C in the lateral direction (i.e., a left direction in FIGS. 18 and 19) and the airflow from the fan 252K in the direction toward the opening 241. Here, the airflow from the fan 252K hits the planar member 235 and the airflows from the fans 252M and 252C hit the respective fans 52Y and 52M disposed to the immediate right side thereof. By so doing, the airflow flowed to the left direction is generated.

Of the airflows of the fans 252Y, 252M, 252C, and 252K, the airflow exhausted at the lower speed hits a slope 251 of an airflow guide part and forms a vortex, as illustrated in FIG. 18. Due to the vortex, the slow airflow causes the energy loss and degrades the airflow efficiency.

Figure 20:
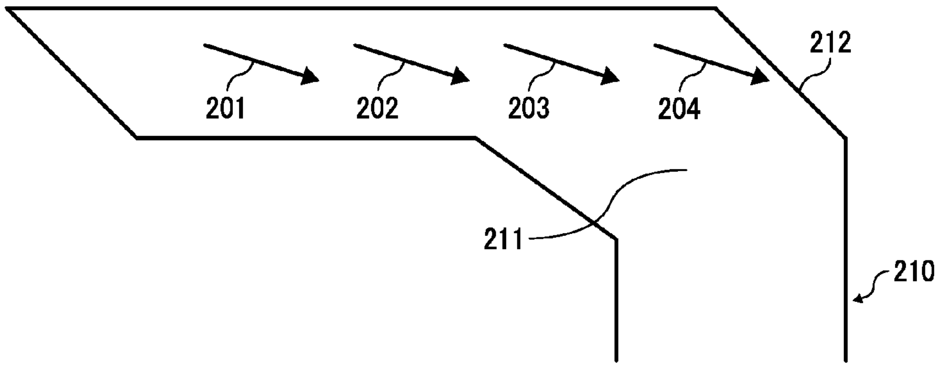
FIG. 20 is a diagram illustrating airflows in a comparative image forming apparatus.

A description is given of another comparative configuration of an airflow collection channel 210, with reference to FIG. 20.

To efficiently and reliably cool multiple cooling target parts using limited space, a comparative cooling device having the comparative configuration includes multiple air flowing devices to blow air to the respective multiple cooling target parts. With the comparative configuration, the airflows exhausted from the multiple air exhausting channels provided to the respective multiple cooling target parts are flowed from an air collection channel to an air flowing channel without the exhausted airflows interfering each other.

However, it has been difficult for the comparative cooling device to cool the multiple cooling target parts efficiently by using the limited space. For example, in a tandem-type color image forming apparatus, multiple image forming devices are aligned therein and include various image forming components such as development devices and charging devices therein. The image forming devices are susceptible to heat generated by other devices such as a fixing device and/or to their own heat such as friction heat generated by a rotary body. The heats can increase the temperatures in the image forming devices, which can result in operation failure of the image forming apparatus. Specifically, when the temperature of the development device reaches a given high temperature, particles of toner contained therein can adhere to each other, and therefore output images can result in image failure.

To address this inconvenience, air may need to be reliably flowed to each image forming device, which is a cooling target part, and the airflows exhausted from the respective image forming devices may need to be collected and exhausted to the outside of the image forming apparatus. However, if the airflows exhausted from the respective image forming devices disposed adjacent to each other interfere with each other, the flows of air to be flowed to and exhausted from the respective image forming devices can stagnate. Consequently, the airflow efficiency of the image forming devices can be degraded.

In addition, it is difficult that the comparative cooling device enhances the exhaust efficiency. As illustrated in FIG. 20, when airflows 201, 202, 203, and 204 that have cooled the respective image forming devices pass an elbow-shaped bend 211 of an airflow collection channel 210, the airflow 204 that flows closest to the elbow-shaped bend 211 hits a wall 212 of the elbow-shaped bend 211. This can resist or hinder movement of the airflow 204 and result in a degradation of the exhaust efficiency of the image forming device.

Different from the above-described comparative configurations, the image forming apparatus 100 according to the present embodiment can obtain high airflow efficiency. With reference to FIGS. 21 through 25, a detailed description is given of the configuration of the image forming apparatus 100.

Figure 21:
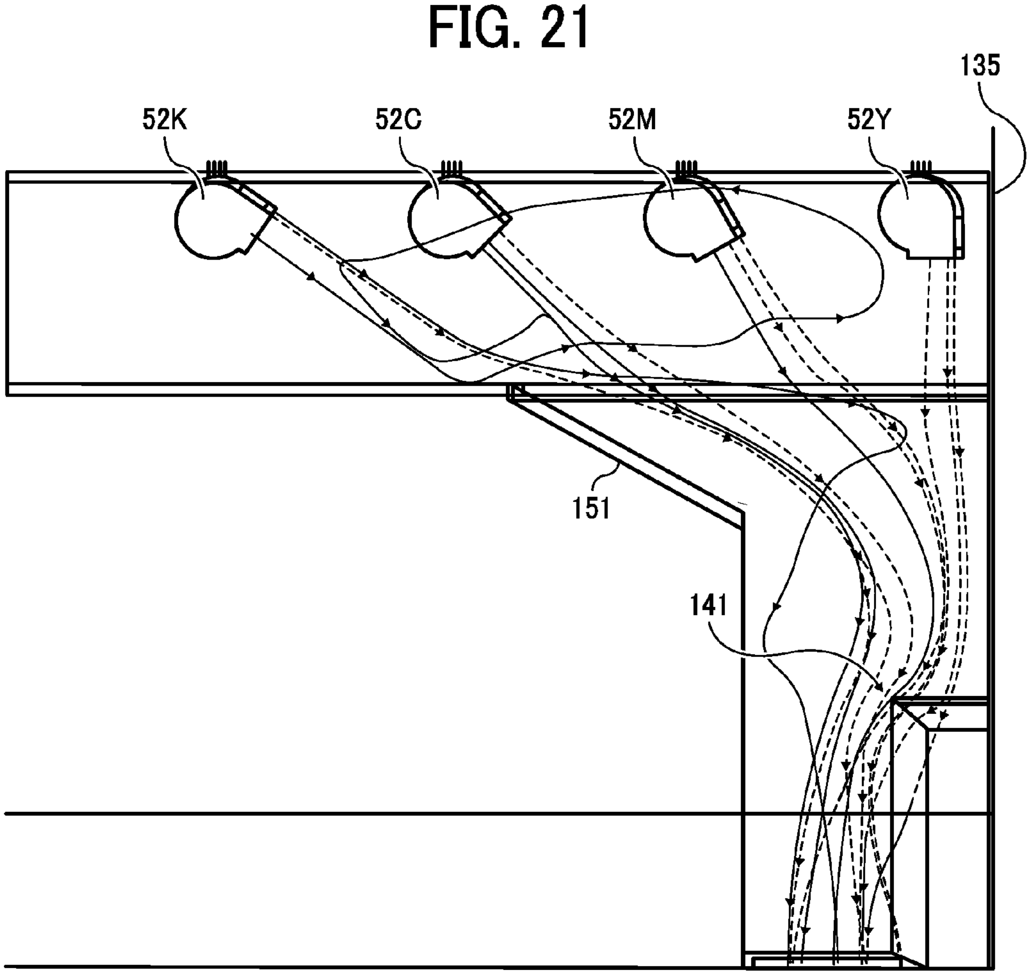
FIG. 21 is shows results of simulation of airflows in the image forming apparatus according to the present embodiment.
Figure 22:
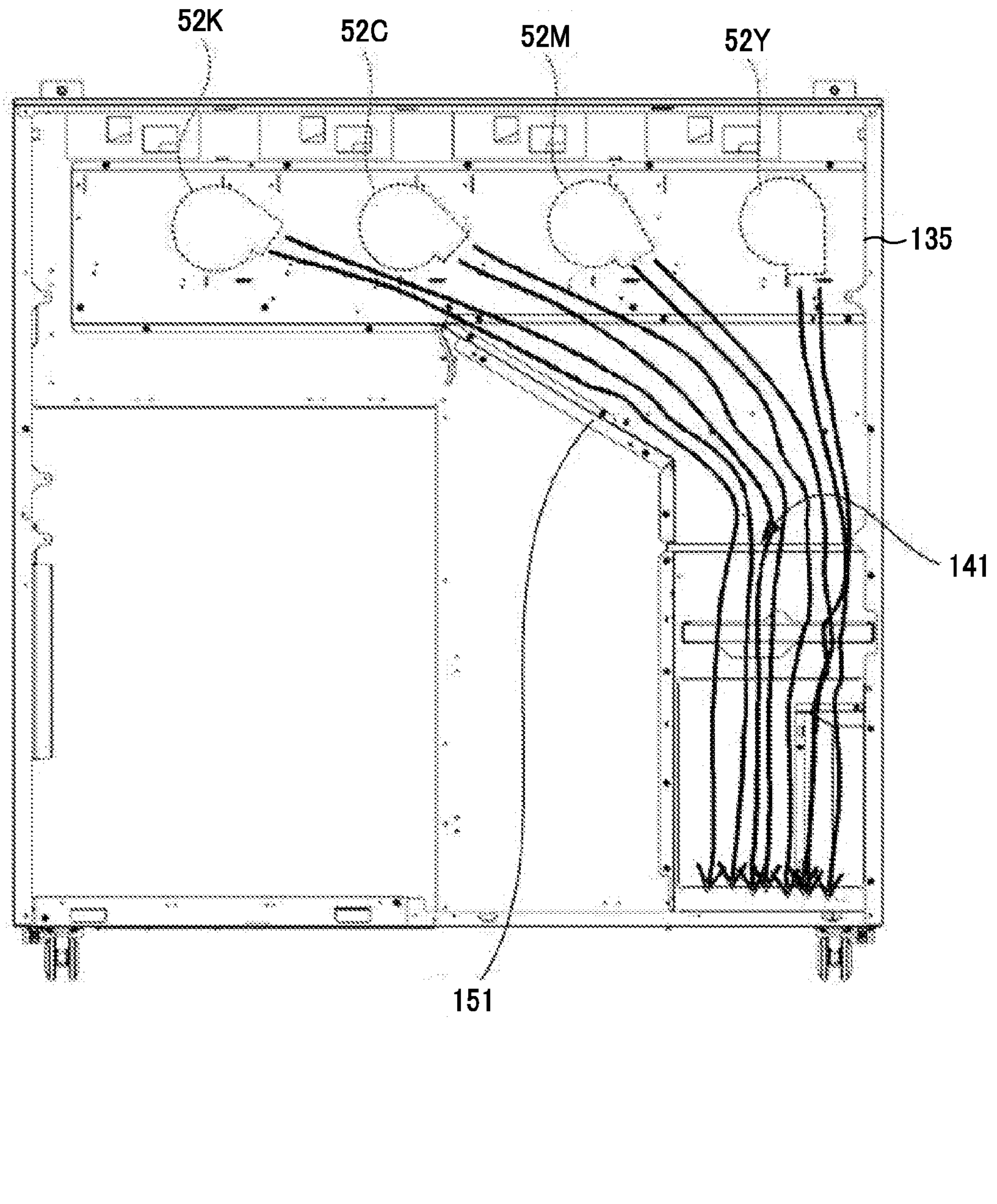
FIG. 22 is shows the result of simulation of the airflows at high speed among the airflows in FIG. 21.

FIG. 21 shows results of simulation of airflows in the image forming apparatus 100 according to the present embodiment. FIG. 22 shows the result of simulation of the airflows at high speed among the airflows in FIG. 21.

In FIGS. 21 and 22, an airflow angle of the fan 52Y is 90 degrees with respect to the horizon, an air flow angle of the fan 52M is 60 degrees with respect to the horizon, an air flow angle of the fan 52C is 45 degrees with respect to the horizon, and an air flow angle of the fan 52K is 35 degrees with respect to the horizontal direction.

As illustrated in FIGS. 21 and 22, the respective airflows do not interfere with each other in the image forming apparatus 100 according to the present embodiment. Therefore, degradation of the airflow efficiency due to stagnation of air flow can be prevented due to the reasons described below.

The airflows from the fans 52Y, 52M, 52C, and 52 do not hit a planar member 135 and the respective fans disposed on the right. Further, the airflows direct to the opening 141 disposed below the fans 52Y, 52M, 52C, and 52 to reduce interference with each other.

Figure 23:
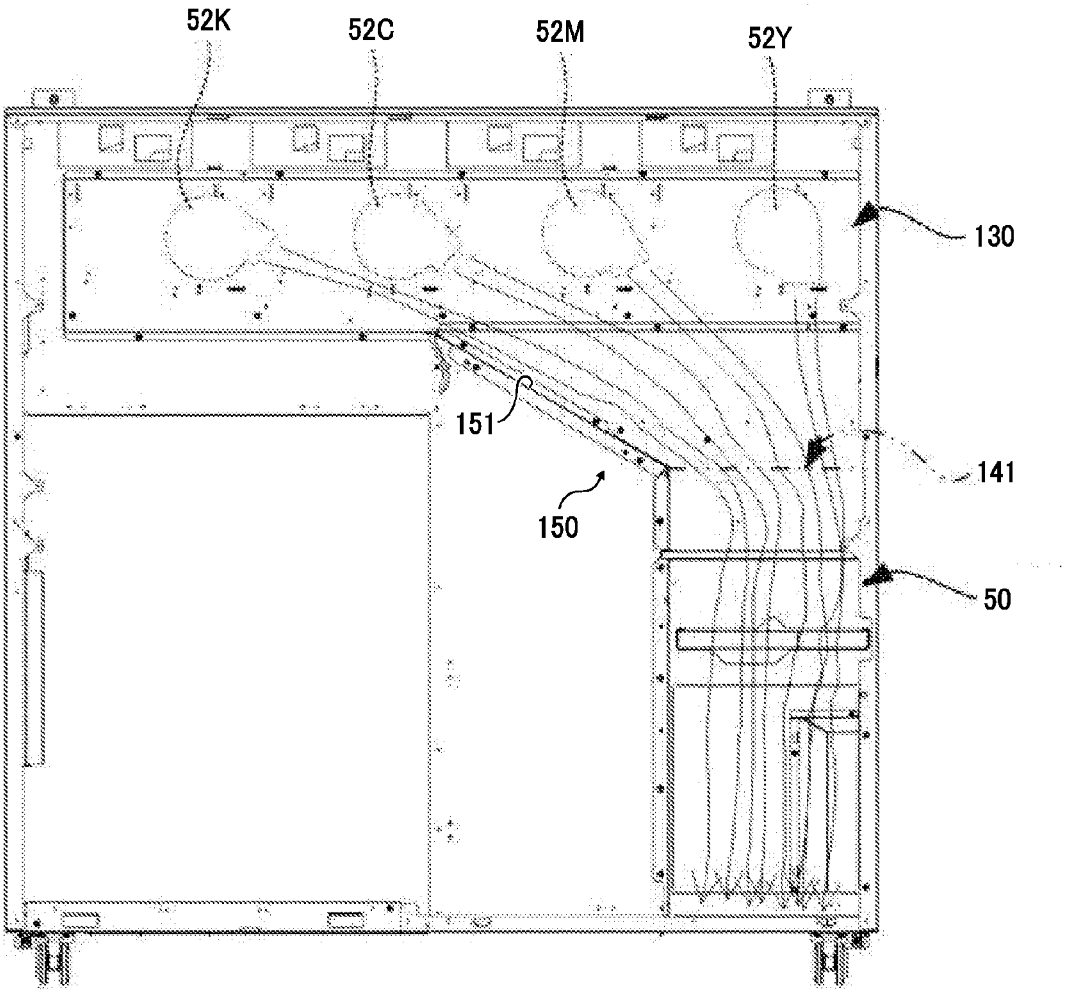
FIG. 23 is a diagram illustrating airflows in the image forming apparatus according to the present embodiment.
Figure 24:
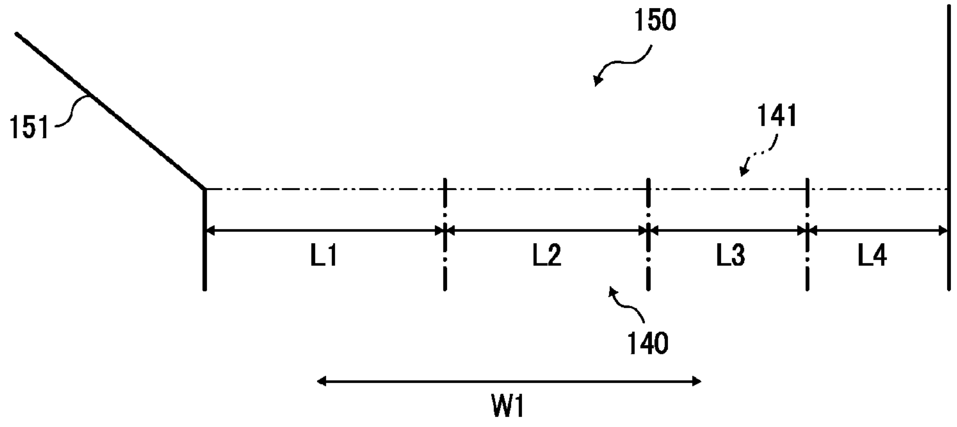
FIG. 24 is a diagram illustrating an example of respective air inflow regions of the fans in the image forming apparatus according to the present embodiment.
Figure 25:
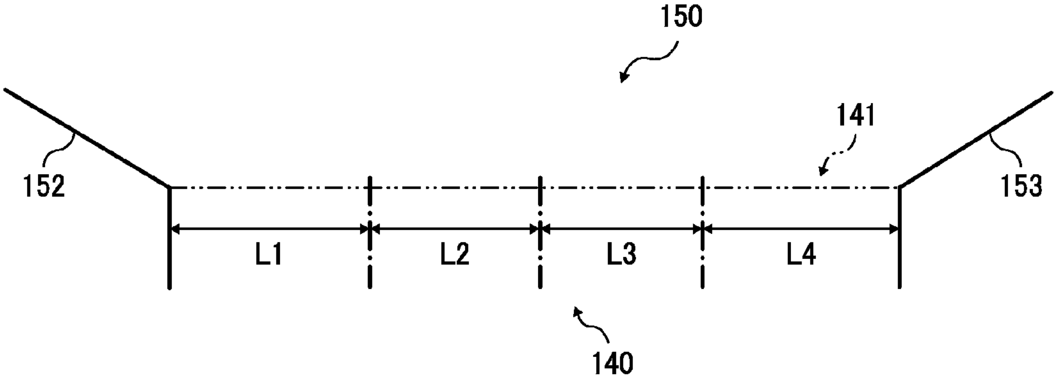
FIG. 25 is a diagram illustrating another example of respective air inflow regions of the fans in the image forming apparatus according to the present embodiment.

A description is given of the reasons of setting the above-described air flow angles of the fans 52Y, 52M, 52C, and 52K, with reference to FIGS. 23 through 25.

FIG. 23 is a diagram illustrating airflows in the image forming apparatus 100 according to another embodiment. The rear face unit 110 includes the air blower distributing device 130 and the airflow guide part 150. The air blower distributing device 130 includes the fans 52Y, 52M, 52C, and 52K. The airflow guide part 150 is provided to guide the airflow from the air blower distributing device 130 to the opening 141 of the air collection duct 50 along the slope 151 in a tapered manner.

A portion of the air collection duct 50 has a rectangular cross section through the length from the opening 141 extending downward in the vertical direction.

In the image forming apparatus 100 according to the present embodiment, respective air blowing angles for the airflows flowing at high speed among the airflows from the fans 52Y, 52M, 52C, and 52K is set, so that the high-speed airflows can enter and pass through the opening 141 of the air collection duct 50 without interference. In the image forming apparatus 100 according to the present embodiment, the opening 141 is disposed below the fan 52Y. Therefore, directions to flow the respective airflows to the opening 141 are determined and set according to respective distances from the filter member 142 to the fans 52Y, 52M, 52C, and 52K.

The airflows of the fans 52Y, 52M, 52C, and 52K are set as follows.

FIG. 24 is a diagram illustrating respective air inflow regions of the fans 52Y, 52M, 52C, and 52K in the image forming apparatus 100 according to the present embodiment. The airflows from the fans 52Y, 52M, 52C, and 52K are directed to air inflow regions L1, L2, L3, and L4 at the opening 141. The lengths in a width direction (indicated by a left-and-right arrow shown in FIG. 24) of the air inflow regions L1, L2, L3, and L4 are determined to have a relation of L1>L2>L3>L4. Specifically, the airflows from the fans 52Y, 52M, 52C, and 52K are directed to the opening 141 to flow in the different regions L1, L2, L3, and L4 in alignment. The lengths of the air inflow regions L1, L2, L3, and L4 are set to be greater as the positions of the fans 52Y, 52M, 52C, and 52K becomes farther away from the opening 141.

It is to be noted that the air inflow regions L1, L2, L3, and L4 at the opening 141 are not divided strictly. It is acceptable that the airflows from the fans 52Y, 52M, 52C, and 52K are blown to the air inflow regions L1, L2, L3, and L4.

It is to be noted that the configuration of the present embodiment is not limited to the configuration in which the opening 141 of the air collection duct 50 is disposed at the end of the fans 52Y, 52M, 52C, and 52K. For example, as illustrated in FIG. 25, the opening 141 can be disposed in the vicinity of a center of alignment of the fans 52Y, 52M, 52C, and 52K. In other words, the opening 141 can be disposed immediately below the fans 52M and 52C. In this case, the airflow guide part 150 includes slopes 152 and 153 to symmetrically taper the channel of the airflows. With this configuration, the lengths of the air inflow regions L2 and L3 to which the airflows form the fans 52M and 52C disposed closer to the opening 141 are reduced (L2=L3) and the lengths of the air inflow regions L1 and L4 corresponding to the fans 52Y and 52K are increased (L1=L4) to be greater than the lengths of the air inflow regions L2 and L3.

A description is given of a different configuration of the air collection duct 50 according to another embodiment.

In this configuration, the fans 52Y, 52M, 52C, and 52K are aligned on a plane parallel to another plane including lines of the edge of the opening 141 and disposed at different positions along a direction perpendicular to an alignment direction of the fans 52Y, 52M, 52C, and 52K (a front-to-back direction). Then, lengths in a direction perpendicular to the direction of the line of air inflow regions at the opening to which the airflows from the fans 52Y, 52M, 52C, and 52K are flowed are set to be equal to each other. It is to be noted that the opening 141 of the air collection duct 50 is disposed at the end of the fans 52Y, 52M, 52C, and 52K.

Figure 26:
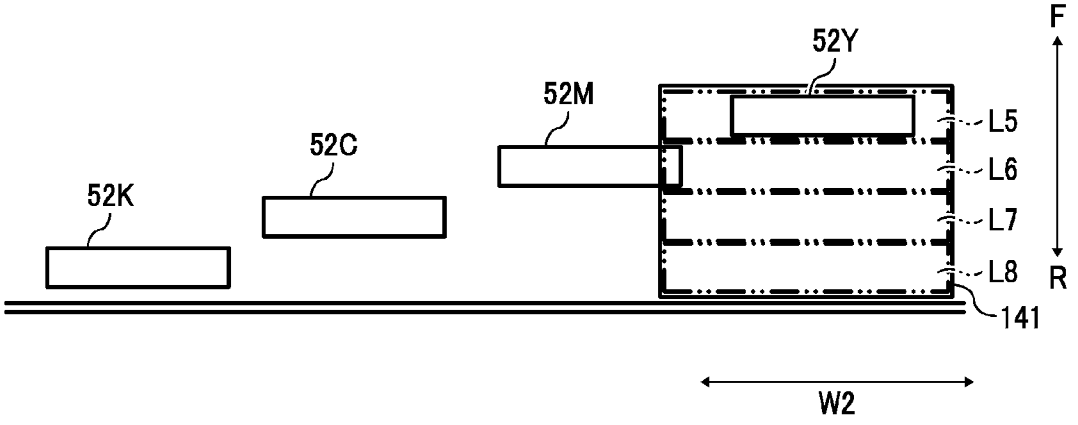
FIG. 26 is a diagram illustrating another example of the air inflow regions for the airflows of the fans toward the opening in the image forming apparatus according to the present embodiment.

FIG. 26 is a diagram illustrating the air inflow regions for the airflows of the fans 52Y, 52M, 52C, and 52K toward the opening 141 in the image forming apparatus 100 according to another embodiment.

It is to be noted that, in FIG. 26, an upper portion of the drawing sheet indicates the front side (F) and a lower portion of the drawing sheet indicates the rear side (R).

As illustrated in FIG. 26, the fans 52Y, 52M, 52C, and 52K are disposed at difference positions shifted from the front side to the rear side of the image forming apparatus 100. In this configuration, the airflow from the fan 52Y is flowed to an air inflow region L5, the airflow from the fan 52M is flowed to an air inflow region L6, the airflow from the fan 52C is flowed to an air inflow region L7, and the airflow from the fan 52K is flowed to an air inflow region L8, so that the airflows from the 52Y, 52M, 52C, and 52K blown at high speed flow to the air inflow regions L5, L6, L7, and L8. Here, the lengths of the air inflow regions L5, L6, L7, and L8 from the front side to the rear side are equal to each other.

According to the configuration of the present embodiment, the fans 52Y, 52M, 52C, and 52K may need to blow the airflow to the width W2 of the opening 141. Therefore, the respective angles of the fans 52Y, 52M, 52C, and 52K can be set more flexibly. As a result, the interference of airflows from adjacent fans can be prevented.

The above-described embodiments are illustrative and do not limit the present invention. Thus, numerous additional modifications and variations are possible in light of the above teachings. For example, elements at least one of features of different illustrative and exemplary embodiments herein may be combined with each other at least one of substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. A cooling device comprising:

multiple air blowers to cool a cooling target provided to an image forming apparatus; and a duct to connect with the multiple air blowers provided at different angles with respect to each other, and to flow airflow generated by the multiple air blowers therethrough, the duct having an opening formed thereon and disposed at a position shifted to a part of the multiple air blowers, wherein respective outputs of the multiple air blowers are different from each other according to respective positions of the multiple air blowers with respect to the opening.

2. The cooling device according to claim 1, wherein, of the multiple air blowers, an air blower disposed farther than another air blower from the opening has an output greater than the another air blower.

3. The cooling device according to claim 1, further comprising an electric signal generator to generate an electric signal to control the outputs of the multiple air blowers, wherein the multiple air blowers are controlled by the output previously set by the electric signal generator.

4. The cooling device according to claim 1, wherein the multiple air blowers have an identical maximum output.

5. An image forming apparatus comprising:

the cooling device according to claim 1; and multiple image forming devices to form an image on each surface thereof, the multiple image forming devices comprising multiple development devices and multiple charging devices, wherein the cooling target corresponds to at least the multiple development devices, wherein the multiple development devices include a black development device for developing black images and color development devices for developing respective color images, wherein each of the multiple image forming devices selectively forms an image in a monochrome mode and an image in a color mode, wherein the output of the air blower to cool the black development device in the monochrome mode is smaller than the output thereof in the color mode, wherein the outputs of the other air blowers for the color development devices are equal on the monochrome mode and different in the multicolor mode.

6. The image forming apparatus according to claim 5, wherein the air blower cooling one of the black development device and a black process cartridge is disposed at a position closest to the opening.

7. An image forming apparatus comprising:

a cooling device including multiple air blowers to cool a cooling target provided to an image forming apparatus; and a duct to connect with the multiple air blowers and to flow airflow generated by the multiple air blowers therethrough, the duct having an opening formed thereon and disposed at a position shifted to a part of the multiple air blowers, respective outputs of the multiple air blowers are different from each other according to respective positions of the multiple air blowers with respect to the opening; and multiple image forming devices to form an image on each surface thereof, the multiple image forming devices comprising multiple development devices, multiple charging devices, and multiple image carriers corresponding to the multiple development devices, wherein the cooling target corresponds to at least the multiple development devices, wherein the multiple development devices and the multiple image carriers are included in multiple process cartridges detachably attached to the apparatus body thereof, wherein each of the multiple image forming devices selectively forms an image in a monochrome mode and an image in a color mode, wherein the output of an air blower to cool the black development device in the monochrome mode is smaller than the output thereof in the color mode, wherein the outputs of the other air blowers to cool the respective color development devices in the monochrome mode are equal to each other.

8. The image forming apparatus according to claim 7, wherein the air blower to cool one of the black development device and a black process cartridge is disposed closest to the opening.

9. An image forming apparatus comprising:

the cooling device according to claim 1;

an apparatus body; and multiple image forming devices to form an image on each surface thereof, wherein the multiple development devices are included in multiple process cartridges detachably attached to the apparatus body thereof, wherein the cooling target corresponds to the multiple development devices included in the multiple image forming devices, wherein each of the multiple image forming devices selectively forms an image in a monochrome mode and an image in a color mode, wherein the output of an air blower to cool the black development device in the monochrome mode is smaller than the output thereof in the color mode, wherein the outputs of the other air blowers to cool the respective color development devices in the monochrome mode are equal to each other.

10. The image forming apparatus according to claim 9, wherein the air blower cooling one of the black development device and the black process cartridge is disposed at a position closest to the opening.

11. A cooling device comprising:

multiple air blowers to cool a cooling target provided to an image forming apparatus; and a duct to connect with the multiple air blowers provided at different angles with respect to each other, and to pass respective airflows generated by the multiple air blowers therethrough, the duct having an opening formed at a position facing a part of the multiple air blowers to pass the airflows from the multiple air blower therethrough, wherein the multiple air blowers inflow the respective airflows in a previously determined direction, wherein airflows exhausted from each of the multiple air blowers at a high speed enter into respective different regions on the opening without interference with each other.

12. The cooling device according to claim 11, wherein the duct includes an airflow guide part having a tapered shape to guide the airflow from the multiple air blowers to the opening.

13. The cooling device according to claim 11, wherein the opening has a rectangular edge having lines parallel to an alignment direction of the multiple air blowers, wherein the airflows flowing from the multiple air blowers to the opening enter the respective different regions, wherein lengths of the respective different regions along the alignment direction of the multiple air blowers are set greater as an air blower is disposed farther than another air blower from the opening.

14. The cooling device according to claim 11, wherein the opening has a rectangular edge having lines parallel to an alignment direction of the multiple air blowers, wherein the multiple air blowers are aligned on a plane parallel to another plane including the lines of the edge of the opening and are disposed at different positions along a direction perpendicular to the alignment direction of the multiple air blowers.

15. The cooling device according to claim 14, wherein the airflows flowing from the multiple air blowers to the opening enter the respective different regions, wherein lengths of the respective different regions in the direction perpendicular to the alignment direction of the multiple air blowers are set equal to each other.

16. An image forming apparatus comprising:

the cooling device according to claim 11; and an image forming device to form an image on a recording medium and to serve as the cooling target to be cooled by the cooling device.

* * * * *